United States Patent
Howe

(10) Patent No.: US 12,096,691 B2
(45) Date of Patent: *Sep. 17, 2024

(54) PELTIER WITH OPTIMAL LEVELS OF AUGMENTING RADIATION

(71) Applicant: HOWE INDUSTRIES LLC, Scottsdale, AZ (US)

(72) Inventor: Troy Howe, Scottsdale, AZ (US)

(73) Assignee: HOWE INDUSTRIES LLC

( * ) Notice: Subject to any disclaimer, the term of this patent is extended or adjusted under 35 U.S.C. 154(b) by 0 days.

This patent is subject to a terminal disclaimer.

(21) Appl. No.: 17/533,205

(22) Filed: Nov. 23, 2021

(65) Prior Publication Data

US 2022/0263005 A1 Aug. 18, 2022

Related U.S. Application Data

(60) Provisional application No. 63/117,344, filed on Nov. 23, 2020.

(51) Int. Cl.
*H10N 10/13* (2023.01)
*H10N 10/857* (2023.01)
*B64G 1/16* (2006.01)

(52) U.S. Cl.
CPC .......... *H10N 10/13* (2023.02); *H10N 10/857* (2023.02); *B64G 1/16* (2013.01)

(58) Field of Classification Search
CPC ......... H01L 35/26; H01L 35/30; H10N 10/13; H10N 10/857
See application file for complete search history.

(56) References Cited

U.S. PATENT DOCUMENTS

| | | | | | |
|---|---|---|---|---|---|
| 3,005,944 | A | * | 10/1961 | Hill | H02M 7/068 363/45 |
| 3,738,873 | A | * | 6/1973 | Cathey | G21H 1/10 136/202 |
| 2010/0206349 | A1 | * | 8/2010 | Lee | H01L 35/20 250/492.2 |
| 2011/0056531 | A1 | * | 3/2011 | Meisner | G21G 1/06 136/201 |
| 2016/0315243 | A1 | * | 10/2016 | Wu | H10N 10/01 |

OTHER PUBLICATIONS

Whalen, Scott A., et al. "Improving power density and efficiency of miniature radioisotopic thermoelectric generators", Journal of Power Sources, 180, pp. 657-663. (Year: 2008).*

* cited by examiner

*Primary Examiner* — Tamir Ayad
(74) *Attorney, Agent, or Firm* — PIERSON FERDINAND LLP; Keats Quinalty

(57) ABSTRACT

A thermoelectric cooler including a thermoelectric junction and a radiation source. The thermoelectric cooler includes n-type material, p-type material, and an electrical power source. The radiation source emits ionizing radiation that increases electrical conductivity of the n and p type materials. Also detailed is a method of using radiation to reach high coefficient of performance (COP) values with a thermoelectric cooler that includes providing a thermoelectric cooler and a radiation source, with the thermoelectric cooler including an n-type material, p-type material, an electrical power source, and emitting ionizing radiation with the radiation source to increase the electrical conductivity which strips electrons from the n-type material, the p-type material, or both the n-type material and p-type material from their nuclei with the electrons then free to move within the material.

3 Claims, 23 Drawing Sheets

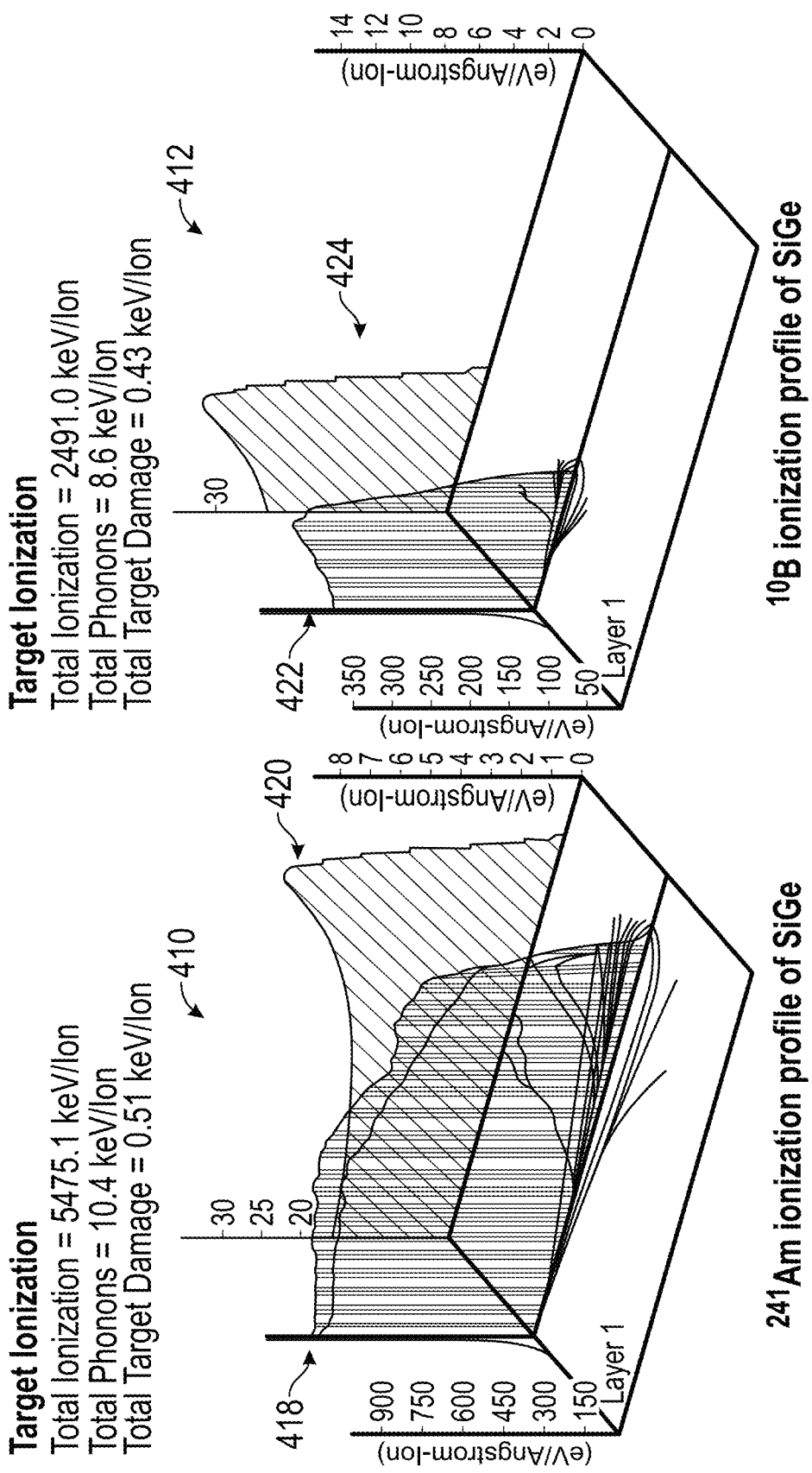

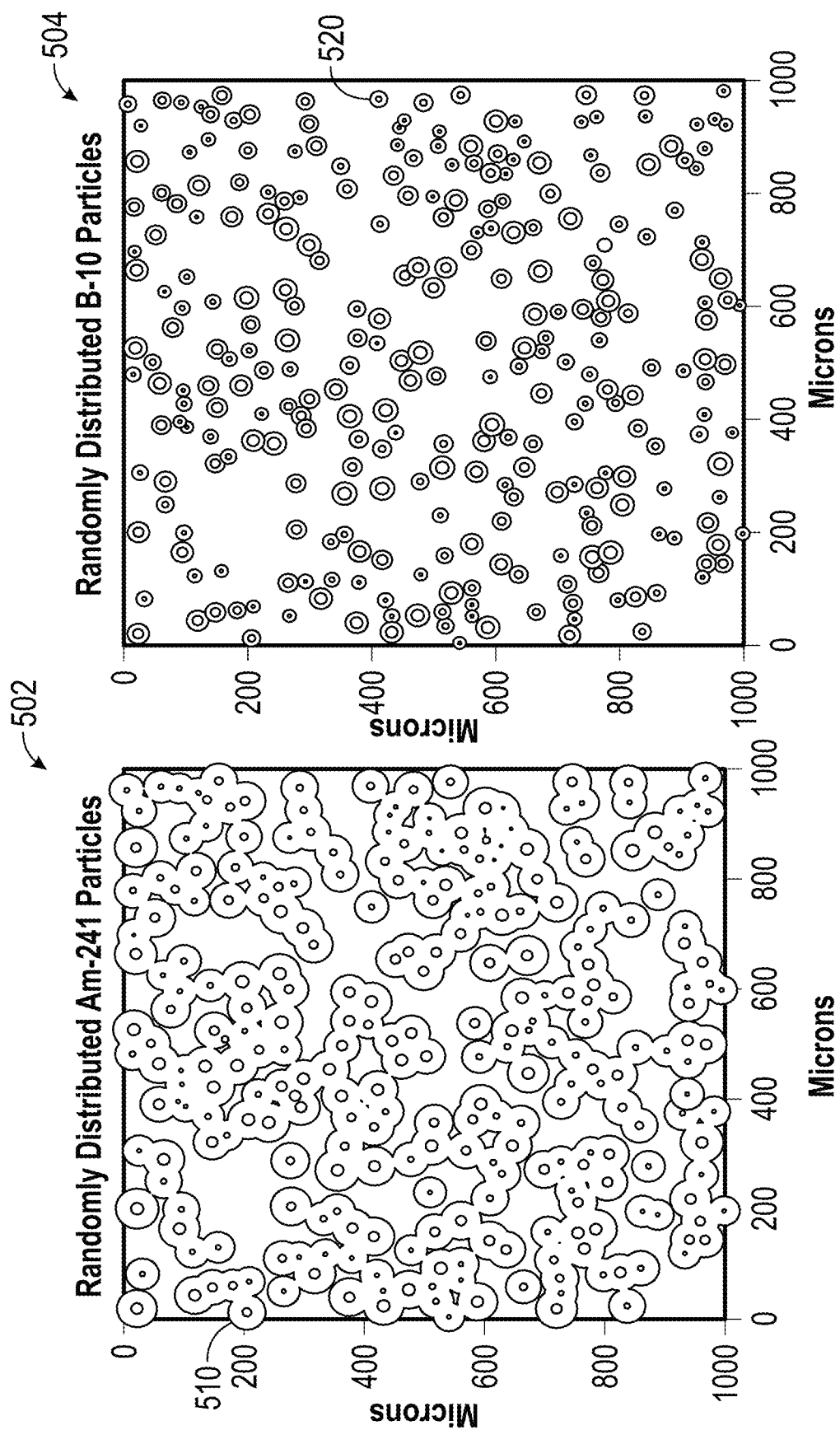

US 12,096,691 B2

PELTIER WITH OPTIMAL LEVELS OF AUGMENTING RADIATION

CROSS-REFERENCE TO RELATED APPLICATIONS

The present invention claims the benefit of priority of U.S. Provisional Application No. 63/117,344, filed Nov. 23, 2020, the entirety of which is incorporated herein by reference.

GOVERNMENT STATEMENT

The invention was made by an agency of the United States Government or under a contract with an agency of the United States Government. The name of the U.S. Government agency and Government contact number are: NASA (Shared Services Center, NSSC), Contact No. 80NSSC19K0962.

TECHNICAL FIELD

The present disclosure relates to using ionizing radiation in conjunction with a thermoelectric device to create a temperature difference.

SUMMARY

Peltier coolers are solid state cooling devices which utilize the Seebeck effect to create a temperature differential using electrical power. The concept is similar to a thermoelectric generator, which uses a temperature differential to create electricity, but run in reverse. Peltier coolers function when an applied voltage creates a current through two dissimilar thermoelectric materials which are joined at a junction point. The different material properties create a thermal gradient as electrons attempt to move through the junction. Thus, using only a solid-state assembly and electrical inputs, heat can be transported from one area to another. Unfortunately, the performance of these coolers is often quite low, and they have not become suitable for widespread use.

Aspects and applications presented herein are described below in the drawings and detailed description of the exemplary embodiments shown. Unless specifically noted, it is intended that the words and phrases in the specification and the claims be given their plain, ordinary, and accustomed meaning to those of ordinary skill in the applicable arts.

In the following description, and for the purposes of explanation, numerous specific details are set forth in order to provide a thorough understanding of the various aspects of the exemplary embodiments shown. It may be understood, however, by those skilled in the relevant arts, that the presented exemplary embodiments may be practiced without these specific details. In other instances, known structures and devices are shown or discussed more generally in order to avoid obscuring the exemplary embodiments shown. In many cases, a description of the operation is sufficient to enable one to implement the various forms of the exemplary embodiments shown, particularly when the operation is to be implemented in software. It should be noted that there are many different and alternative configurations, devices and technologies to which the disclosed exemplary embodiments shown may be applied. The full scope of the exemplary embodiments shown are not limited to the examples that are described below.

BRIEF DESCRIPTION OF THE DRAWINGS

FIGS. 4A through 4F illustrate penetration depth and the ionization profile of different alpha particle sources within a SiGe TEC foot FIGS. 5A and 5B show the difference between a 241 Am source and a $10B(n,\alpha)$ source and its corresponding change in the volume influenced by radiation induced conductivity (RIC).

DETAILED DESCRIPTION

In one aspect, the embodiments detailed herewithin, apply to any thermoelectric cooler (TEC) or Peltier cooler which utilizes ionizing radiation to increase performance. The exemplary devices as described herein can be made of any material that allows them to function as power conversion systems, and may include a variety of different radiation sources.

Figure 1:
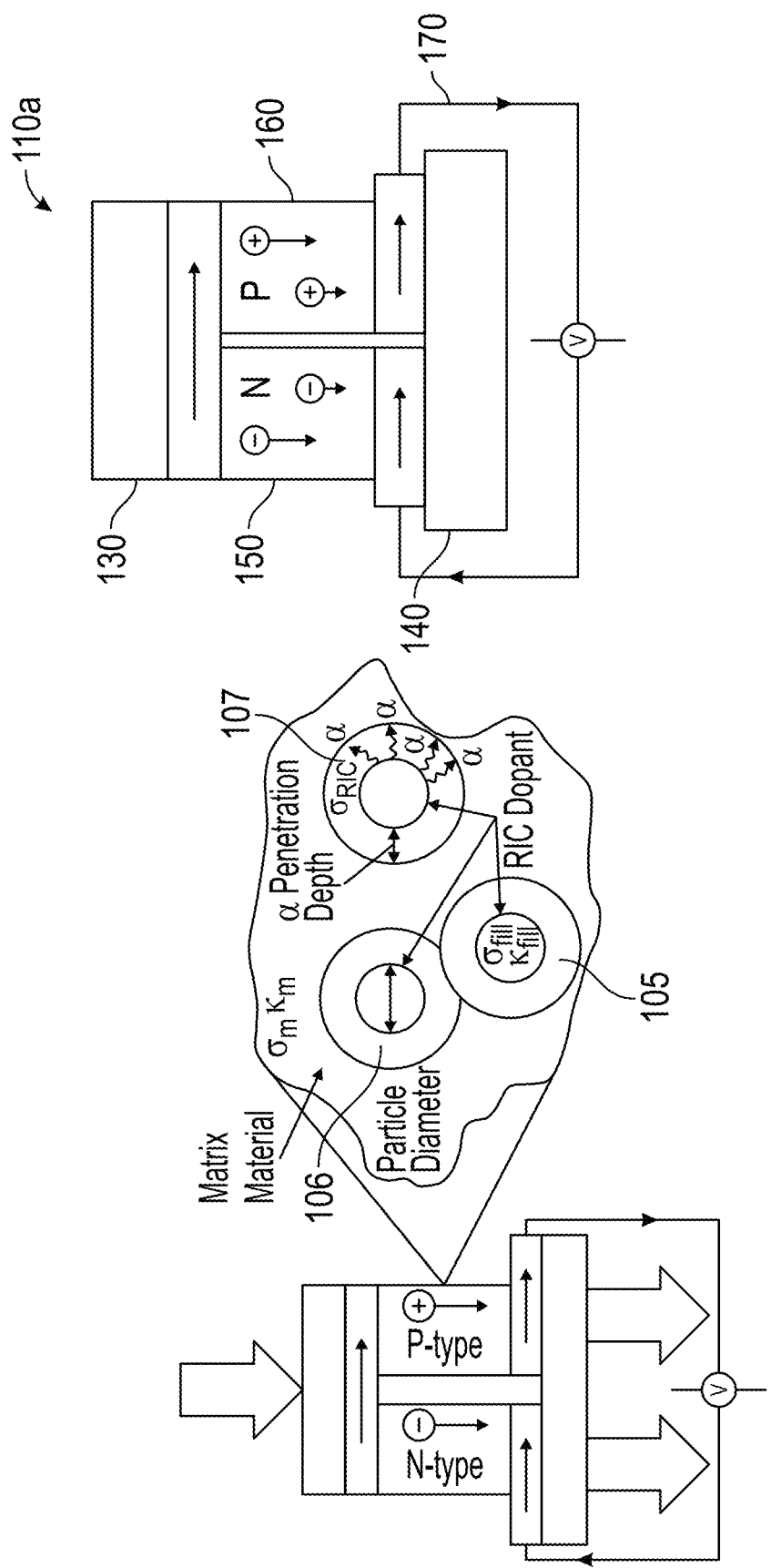
FIG. 1 shows a system with augmented thermoelectric coolers known as Peltier with Optimal Levels of Augmenting Radiation, or POLAR, coolers.

FIG. 1 illustrates system 100 comprising augmented thermoelectric coolers (POLARs) 110a in accordance with a first embodiment.

POLARs 110a comprises hot side 130, cold side 140, n-type material 150, and p-type material 160. In one aspect, radiation source 120 emits ionizing radiation (e.g. alpha, beta, gamma, or neutrons), which increases the electrical conductivity (including, e.g., n-type material 150 and p-type material 160) as particle interactions strip electrons in the material from their nuclei, and the affected electrons are free to move within the material.

TEGs function by utilizing the Seebeck effect to change the distribution of electrons within a material due to a heat source applied at one end. This heat source pushes electrons away and towards the cold side, where they build up and create a voltage. By using two different materials in parallel, two different voltages can be achieved, and the difference between these voltages forms a potential that can be used to create an electric circuit, and thus electric power. In addition, if the electrical power is applied to leads of TEGs 110a, a temperature differential is formed on the plates, and the exemplary device can instead provide cooling. This arrangement creates a type of cooler, called a "Peltier cooler", which can also benefit from the augmentation disclosed in exemplary embodiments detailed herein.

Figure 2:
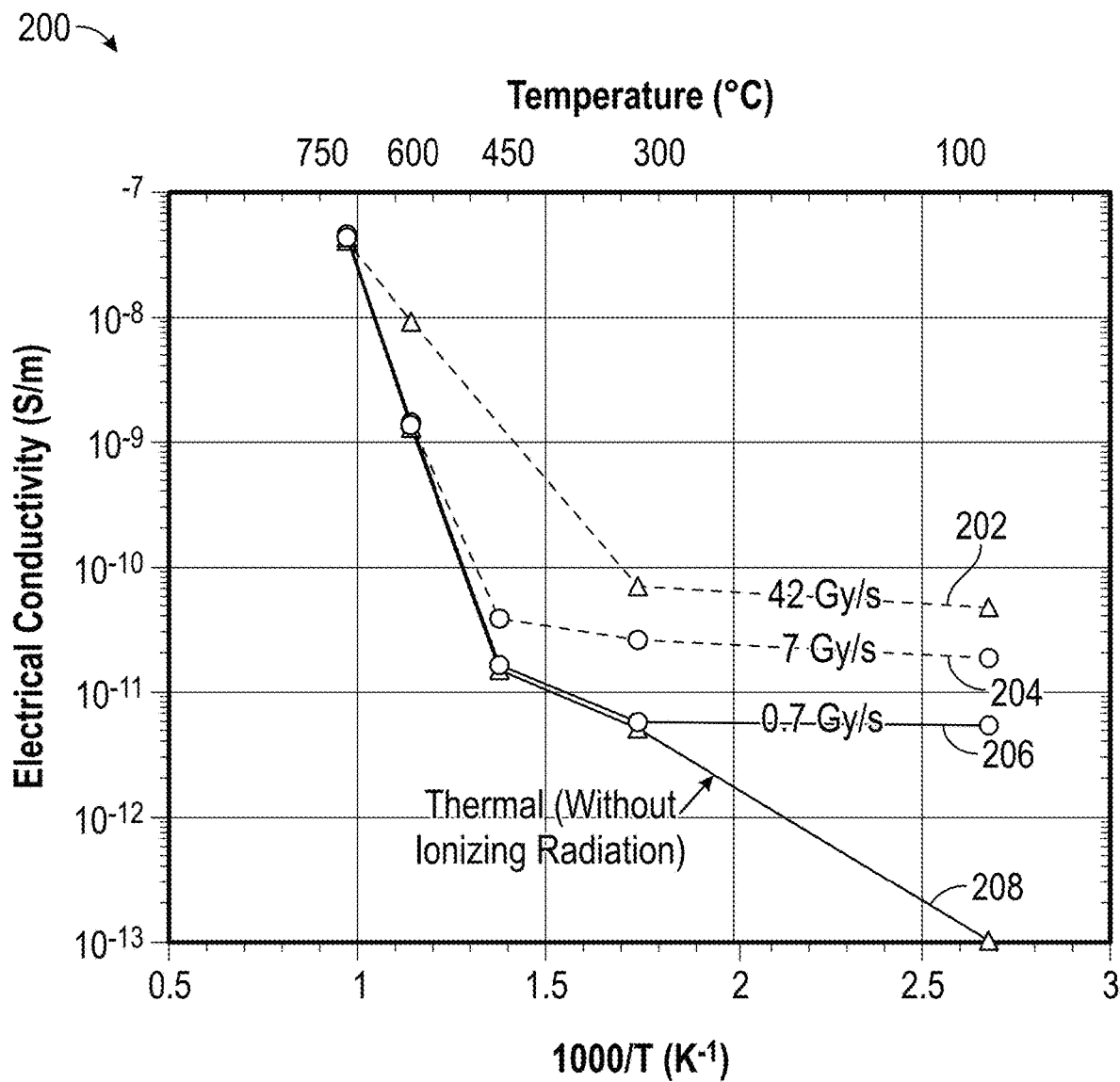
FIG. 2 illustrates a chart showing effects of radiation on electrical conductivity.

FIG. 2 illustrates chart 200 showing effects of radiation on electrical conductivity, according to measurements of the conductivity change in materials exposed to radiation fields in a study by Oak Ridge National Laboratory (additional details available at Shikama, T., et. al. "Electrical properties of ceramics during reactor irradiation," Journal of Nuclear Materials 258-263 (1998), https://www.sciencedirect.com/science/article/abs/pii/S0022311598003006). FIG. 2 shows electrical conductivity components in fine-grained 99.99% purity alumina cable ("CR125"). In FIG. 2, electrical conductivity values as a function of temperature for the sample when irradiated with a dose of 42 Gy/s is shown at 202, electrical conductivity values as a function of temperature for the sample when irradiated with a dose of 7 Gy/s is shown at 204, electrical conductivity values as a function of temperature for the sample when irradiated with a dose of 0.7 Gy/s is shown at 206, and electrical conductivity values as a function of temperature for the sample when not irradiated at all is shown at 208. The major change in conductivity can be seen to occur at relatively low temperatures (100-200° C.) and at radiation levels of 0.7 Gy/s or above as shown at 206. The produced radiation level varies based on the material used, but for strontium the radiation level translates roughly to 0.14 grams of radioisotope per 100 grams of thermoelectric material, or 0.14% of the total mass.

A ZT value is used as the performance metric to characterize the properties of a thermoelectric material. The ZT value of a single thermoelectric material is given by Equation 1:

$$zT = \frac{S^2 T}{\frac{\kappa}{\sigma}} \quad (1)$$

wherein, $\sigma$ is the electrical conductivity, S is the Seebeck Coefficient, and $\kappa$ is the thermal conductivity of a material at temperature T. A larger value of ZT indicates a higher performing thermoelectric material. From this equation, for a constant value of the Seebeck Coefficient, the ZT value increases proportionately for (1) increases in electrical conductivity, (2) increases in temperature, or (3) decreases in thermal conductivity.

A thermoelectric cooler may comprise two materials, such as, for example, a first material comprising a p-type semiconductor and a second material comprising an n-type semiconductor. The performance of TECs depends heavily on the ZT value. For a thermoelectric cooler comprising a p-type semiconductor and an n-type semiconductor, is given by Equation 2:

$$Z\overline{T} = \frac{(S_p - S_n)^2 \overline{T}}{\left(\left(\frac{\kappa_p}{\sigma_p}\right)^{\frac{1}{2}} + \left(\frac{\kappa_n}{\sigma_n}\right)^{\frac{1}{2}}\right)^2} \quad (2)$$

wherein, $\sigma$ is the electrical conductivity, S is the Seebeck Coefficient, and $\kappa$ is the thermal conductivity of a p-type semiconductor and $\sigma$ is the electrical conductivity, S is the Seebeck Coefficient, and $\kappa$ is the thermal conductivity of an n-type semiconductor and the temperature, $\overline{T}$, is the average temperature between hot side 130 and cold side 140.

The maximum theoretical heat removal capability of the thermoelectric cooler may be calculated according to Equation 3:

$$Q_c = (S_m \times T_c \times I) - (0.5 \times I^2 \times R_m) - (K_m \text{DT}) \quad (3)$$

wherein, $S_m$ is the Seebeck coefficient, $T_c$ is the cold side temperature, I is the electric current, $R_m$ is the resistance of the material, $K_m$ is the thermal conductivity of the material, and DT is the temperature difference.

Figure 3:
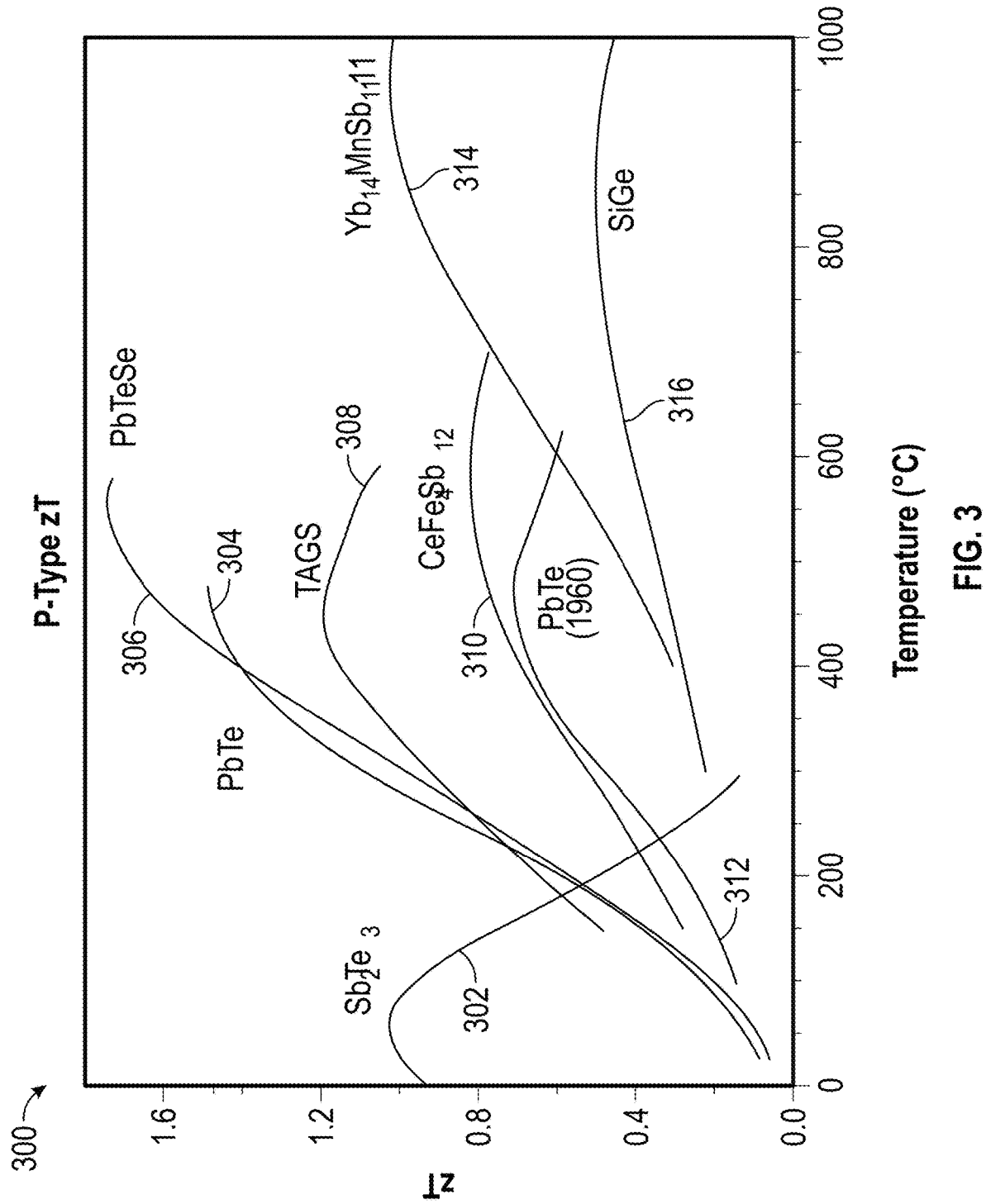
FIG. 3 illustrates ZT values of various thermoelectric materials at various temperatures.

Many TECs have a ZT value around 1, as seen in FIG. 3. FIG. 3 illustrates ZT values of various thermoelectric materials at various temperatures. Using increases in electrical conductivity modeled as 30× due to a 0.7Gy/s dose, a model was generated to calculate efficiency using a TEC material with a ZT of 0.5, a hot side temperature of 200° C., a cold side temperature of 25° C. From this exemplary embodiment, the ratio of efficiencies could be found between the unmodified TEC and the enhanced TEC.

The inclusion of a small amount of alpha or beta producing radioisotope housed safely within the feet of the P-N junction of the TEC emits radiation that improves the performance of the TEC. However, outside radiation sources, such as, for example, accelerators or existing radiation fields, may be used to introduce the ionizing particles. The ionizing radiation emitted by the radiation source excites and ionizes electrons in the material, which increases the electron mobility within the P-N junction feet, which increases the performance of the POLARs. The performance is particularly significant at lower temperatures where efficiency would have been relatively lower.

Although in at least one exemplary embodiment detailed herein a thermoelectric cooler is described as comprising a first material comprising a p-type semiconductor and a second material comprising an n-type semiconductor, alternative embodiments include a variety of materials capable of meeting the parameters detailed herein and could include additional p-type semiconductors or n-type semiconductors.

Advanced Thermoelectric Coolers

In order to increase the figure of merit of thermoelectric coolers to outpace the performance of current deep space and terrestrial systems, in at least one aspect, the presented exemplary embodiments utilize the phenomena known as radiation induced conductivity (RIC). In this process, ionizing radiation causes atoms in the target material to ionize and free electrons, which increases the electrical conductivity of the material. These electrons eventually return to their host nucleus, returning the electrical conductivity of the material to its original state. Radiation can be continuously applied to re-ionize the atom and maintain a constant state of elevated electrical conductivity.

The POLAR units function by irradiating the feet of a thermoelectric cooler and modifying the material properties of the feet. A source of ionization must be present for the POLARs to function, which can be accomplished through two different methods: a radioisotope source or external interactions. Both methods result in POLAR units having the potential to reach comparable efficiency as dynamic refrigeration systems, but without utilizing moving parts.

Radioisotope Source

A common source of ionizing radiation is from radioisotopes, which continuously emit ionizing radiation. Often this is in the form of an alpha particle, which has two protons and two neutrons, and is positively charged. Common radioisotopes include, plutonium-238, americium-241, and polonium-210. The energy of the alpha particle depends on the source and may typically exceed 5 Mega Electron Volt (MeV). Depending on the ionization energy of the foot material, these alpha particles can ionize hundreds of thousands of atoms, and each radioisotope particle can produce billions of alpha particles per second depending on its mass. With a properly designed radioisotope dopant, a continuous supply of ionized atoms and free electrons may be available within the POLAR to maintain the elevated electrical conductivity for the lifetime of the radioisotope.

Hot pressing or spark plasma sintering (SPS) are used to embed the alpha source particles within the POLAR materials. The hot press process comprises heating and compressing powders of the POLAR material and the alpha source particles until they are densified into a solid object. The SPS process is similar but additionally comprises introduction of an electric current. Depending on the material, either hot pressing or SPS may be used. Radioisotope particles would simply be mixed into the powder and pressed down into a usable POLAR foot.

This type of radiation source would provide a stand-alone POLAR that would operate with higher performance in accordance with its half-life. Alpha particles require little in the way of shielding, making it suitable for most applications that require solid state power production from a heat source.

Neutron Interaction

As disclosed herein, the radiation source may comprise an external neutron/gamma source. When a neutron is captured by an atom, that atom undergoes transmutation and, if the resultant nuclide is unstable, it may decay. In this specific case, boron-10 ($10_B$) was used to produce alpha particles through neutron absorption. Boron is an abundant element in many thermoelectric materials and semi-conductor dopants which also advantageously possesses a large neutron capture cross section for thermal neutrons. Natural boron comprises approximately 80% $11_B$ and approximately 20% $10_B$. When a $10_B$ atom captures a neutron, it releases a 2.5 MeV alpha particle and decays into lithium-7. The released alpha particle penetrates into the POLAR foot, thus ionizing the material and freeing electrons to increase the electrical conductivity, similar to the dopant radioisotope sources disclosed herein. Gamma interactions pass through the material while causing ionizations.

A $10_B$ atom has many advantages over radioisotopes, including that: it is not inherently radioactive, it is safer to handle, and it is not regulated by the Nuclear Regulatory Commission (NRC). This allows for testing and validation of the POLAR without the need to obtain radioisotopes. Boron loaded materials were tested at the Kansas State TRIGA reactor to investigate the RIC of a potential thermoelectric material. Results showed a drastic increase in conductivity as predicted (see FIG. 15 and/or additional information can be found at: T. M. Howe, S. D. Howe, J. Miller Novel Deep Space Nuclear Electric Propulsion Spacecraft Nuclear and Emerging Technologies for Space (NETS), 2020).

POLAR Modeling

Investigation into the POLAR was performed to predict the performance of the POLAR with a large variety of inputs. As stated hereinabove, the most effective method to increase the efficiency of TECs is to change the electrical conductivity of the sample. Modification of the Seebeck coefficient and thermal conductivity due to radiation exposure showed positive results as well. However, these factors would not pose as significant changes to the POLARs efficiency as altering the material's electrical conductivity. Previous studies have shown several orders of magnitude difference in electrical conductivity, while changes in thermal conductivity and Seebeck coefficient are limited to only a few factors difference.

Augmented thermoelectric coolers (POLARs) thermocouple may be embedded with RIC dopant particles. The RIC particles have their own thermal conductivity and electrical conductivity separate from the matrix. The matrix also has its own thermal and electrical conductivity separate from the RIC particles. The area at 105, 106, and 107 in FIG. 1 is the RIC influenced area which may see localized increases in electrical conductivity greater than the surrounding matrix. FIG. 1 also illustrates how RIC influence areas can overlap forming a pathway through the material with greater electrical conductivity.

An amount of RIC dopant (radioisotope, or neutron interaction) needs to be added to the thermoelectric material to increase its electrical conductivity to adequate levels. The volume percentage (vol %) and particle size of the RIC dopant directly impacts the electrical conductivity of the sample. Alpha particles are emitted and penetrate into the matrix which causes localized regions of increased conductivity shown at 105, 106, and 107 in FIG. 1. These regions of localized conductivity can overlap, increasing the amount of ionizations these areas. This further increases the electrical conductivity in that area as well. Multiple areas of overlapping RIC influenced areas connect forming a highly conductive pathway through the TEC foot. Addition of RIC dopant particles may affect the thermal conductivity, Seebeck coefficient, and electrical conductivity. A primary concern with more thermally conductive particles, is to avoid forming a pathway through the POLAR foot of high thermally conductive particles, which would reduce the POLARs COP. However, because of the volume of material under RIC influence is greater than the particle vol % this may be unlikely to occur. Areas under the influence of the ionizing radiation are also expected to experience decreases in thermal conductivity and increases in Seebeck coefficient.

However, these changes were overshadowed by the more dominating change in electrical conductivity.

TABLE 1

| Material | NiO (6.67 g/cc) | SiGe (3.01 g/cc) | $Bi_2Te_3$ (7.7 g/cc) | PbTe (8.16 g/cc) |
|---|---|---|---|---|
| $^{238}$Pu (5.6 MeV) | 12.4 | 26.2 | 20.3 | 19.7 |
| $^{241}$Am (5.5 MeV) | 12 | 25.5 | 19.7 | 19.2 |
| $^{10}$B (2.5 MeV) | 4.46 | 8.96 | 7.18 | 7.06 |

TABLE 1 shows alpha particle penetration depth in various thermoelectric generator materials. Penetration depth is directly related to volume of material effected by the radiation induced conductivity. The average alpha particle energy is taken from each source and all penetration depths are represented in microns. The first column in TABLE 1 is the radioisotope material that emits alpha particles with the energies in parenthesis. The next four columns are the matrix materials that the alphas travel through, and the values are how far they go.

FIG. 3 shows ZT values of some common TEC materials. In FIG. 3, ZT values of Sb2Te3 as a function of temperature are shown at 302, ZT values of PbTe as a function of operating temperature are shown at 304, ZT values of PbTeSe as a function of operating temperature as shown at 306, ZT values of TAGS as a function of operating temperature are shown at 308, ZT values of CeFe4Sb12 as a function of operating temperature are shown at 310, ZT values of PbTe as a function of operating temperature using data from designs in the 1960s are shown at 312, ZT values of Yb14MnSb11 as a function of operating temperature are shown at 314, and ZT values of SiGe as a function of operating temperature are shown at 316.

Figure 4B:
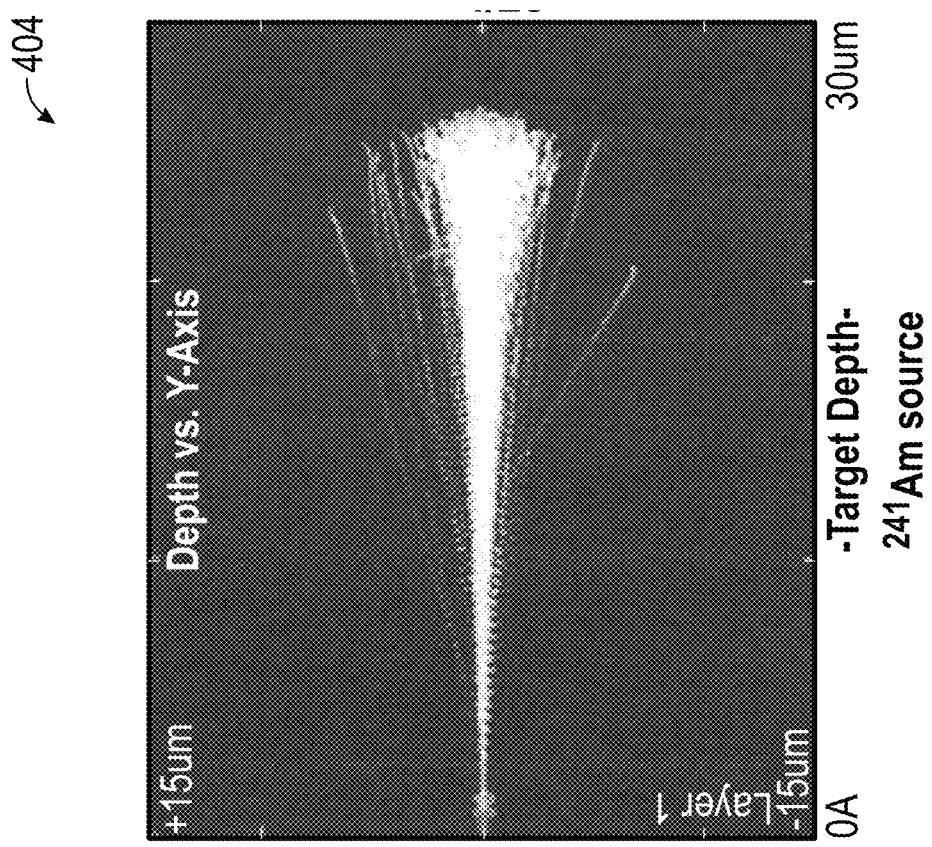
Figure 4A:
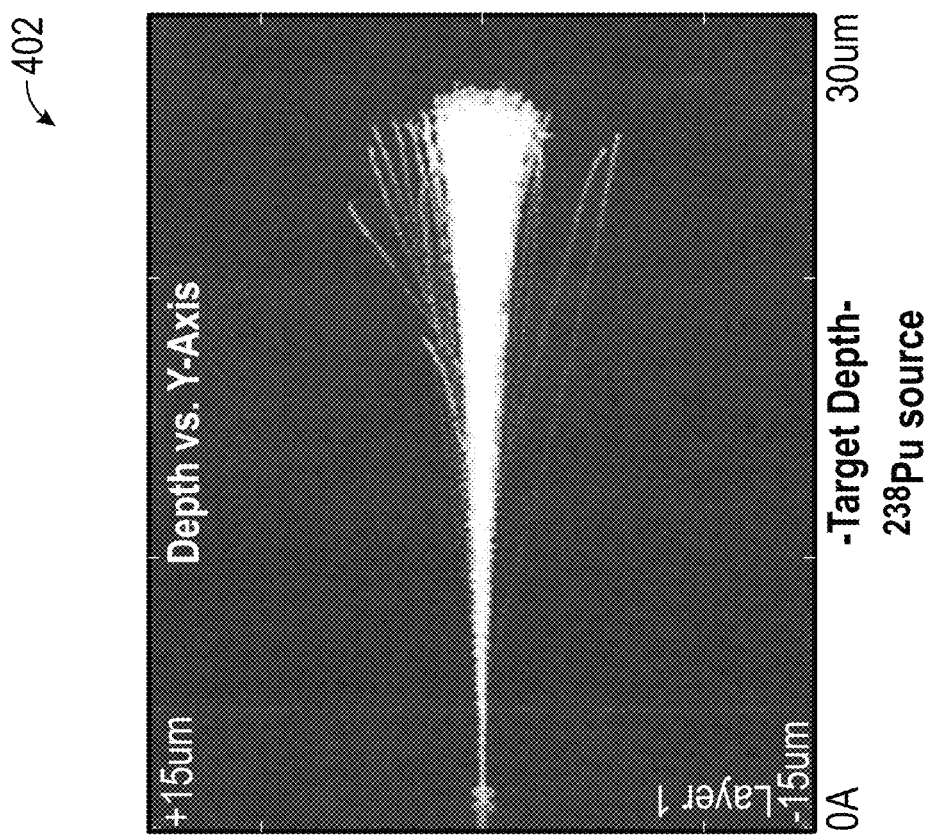
Figure 4D:
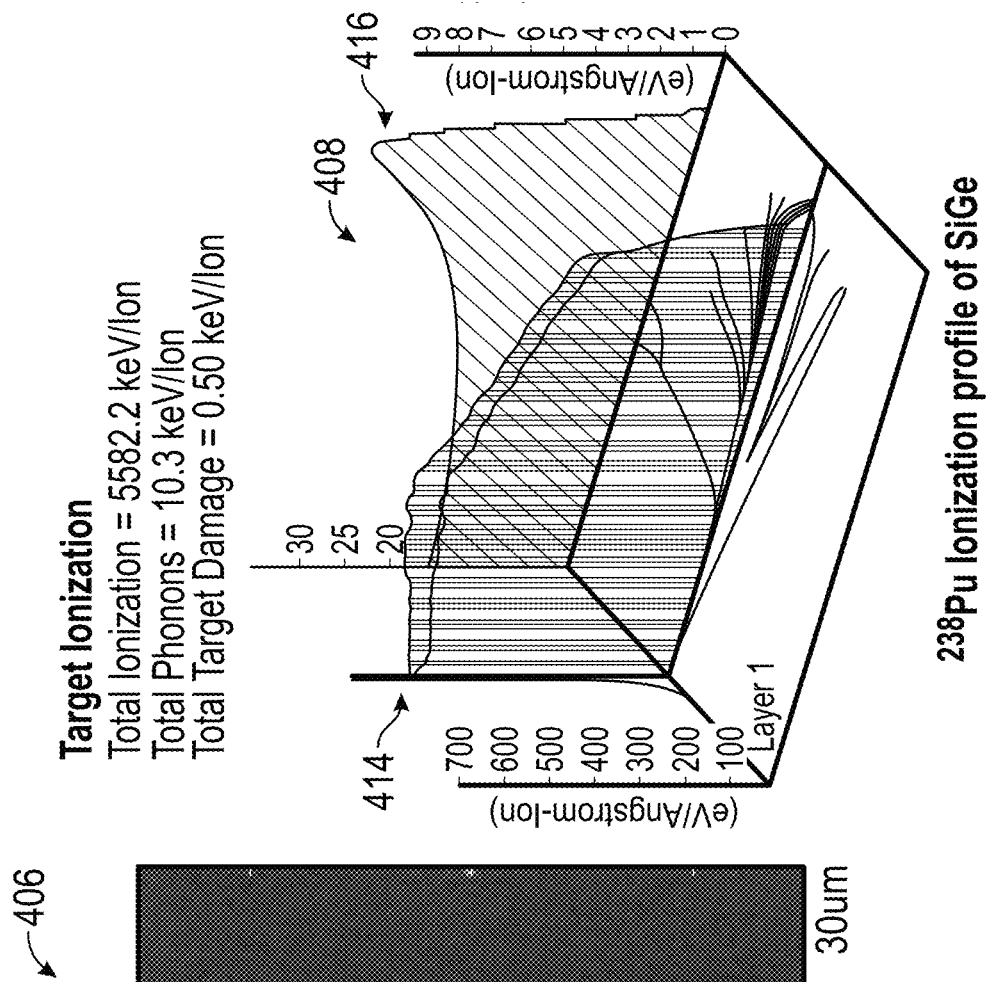
Figure 4C:
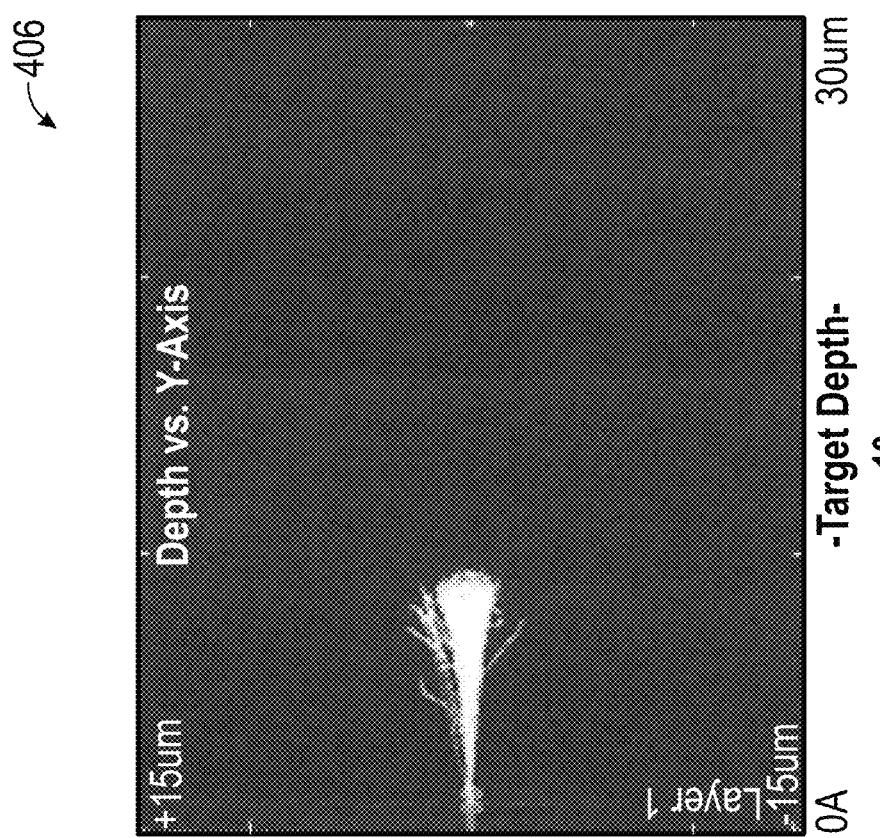

FIGS. 4A through 4F show a simulation of how alpha particles penetrate into materials. The images (402, 404, 406) of FIGS. 4A, 4B, 4C show alpha particles from plutonium, americium, and boron in silicon germanium. Plutonium and americium have deeper penetration depths due to the higher energy alpha particles emitted. The images (408, 410, 412) of FIGS. 4D, 4E, 4F track the number of ionizations in the matrix material (414, 418, 422) and energy lost per angstrom traveled (416, 420, 424) of the alpha particle. FIGS. 4A through 4F illustrates penetration depth and the ionization profile of different alpha particle sources within a SiGe TEC foot, according to an exemplary embodiment. Higher energy alpha particles penetrate further into the material, resulting in larger areas under RIC influence.

The radiation sources described previously all have different alpha particle energy levels, and therefore penetrate to different depths within the thermoelectric material. This behavior is visible in TABLE 1 for some common thermoelectric materials showing the numbers for penetration depth are different for each material/alpha emitter. Boron, with the smallest alpha particle energy, has roughly ⅓ the penetration depth of the two radioisotope sources studied, which would require it to have a higher RIC dopant vol % to reach the same change in electrical conductivity. FIGS. 4A through 4F show how the energy of the alpha particle effects the penetration depth and the number of ionizations within a SiGe matrix. A larger penetration depth can also aid in reducing the amount of radioisotope used per POLAR.

FIGS. 5A and 5B show the difference between a 241 Am source and a 10B (n,α) source and its corresponding change in the volume influenced by RIC. FIG. 5A shows a 241 Am RIC dopant within a SiGe matrix and FIG. 5B shows 10B(n,α) particles within a SiGe matrix. In order to reach the same RIC influence vol % a larger amount of 10B must be used, as the goal is to completely encompass the material under RIC influence. Charts 502 and 504 showing particle distribution and RIC penetration, according to an exemplary embodiment.

Particles 510 of randomly distributed Am-241 of chart 502 and particles 520 of randomly distributed B-10 of chart 504 penetrate to depths due to 5.49 MeV alpha particles and 2.5 MeV particles. In order to cover the same vol % as the 241 Am, larger vol % of the 10B(n,α) may be required.

Decreasing the RIC dopant particle sizes also has a significant effect on the electrical conductivity of the samples. If small particle sizes are used, a larger volume of the POLAR foot may be under RIC influence for the same vol %. Larger particles may result in smaller vol % under RIC influence as the particles may not be as dispersed within the matrix. In samples that contain (n,α) particles this holds true as well, however, particles such as $10_B$ may already be atomistically distributed within the material because it is one of the elements that make up the compounds. This should yield much higher vol % under RIC influence as compared to materials made through sintering with RIC particles.

As shown in FIGS. 5A and 5B, areas within the matrix have overlapping areas of RIC influence. These areas may see increases in electrical conductivity compared to other areas depending on the RIC influence areas that are overlapping. This also means that for each vol % infill and particle size distribution there may be a statistical distribution of RIC coverage that can be expected. This provides valuable information in understanding how much radioisotope of (n,α) must be added to the POLAR foot to achieve the required change in electrical conductivity. These statistical distributions also aid in determining the performance of potential POLAR materials without the need to run countless simulations based on their material properties.

Figure 6:
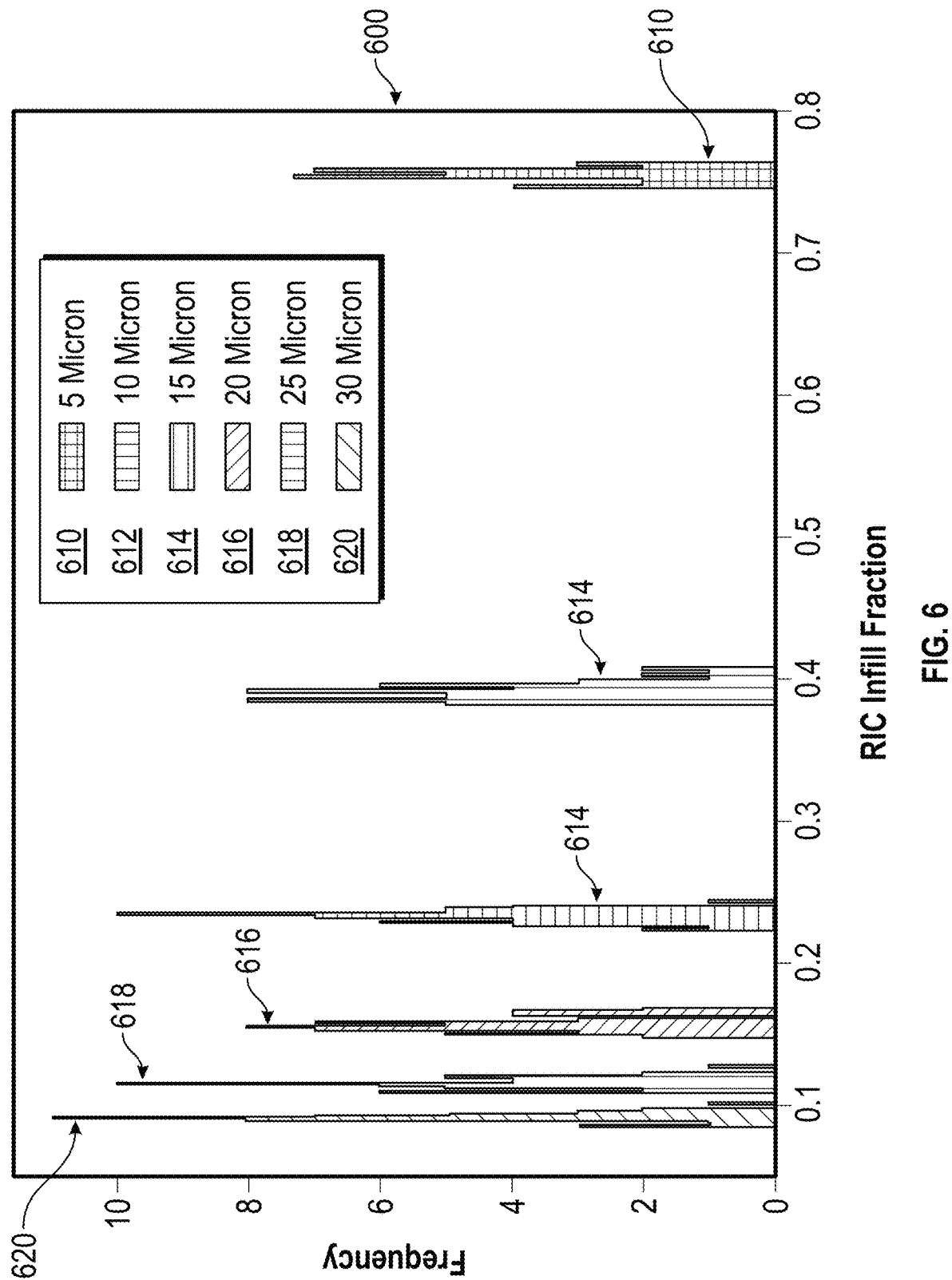
FIG. 6 illustrates a chart showing statistical distribution of RIC influence volume coverage within a PbTe matrix.

FIG. 6 illustrates chart 600 showing statistical distribution of RIC influence volume coverage within a PbTe matrix, according to an exemplary embodiment. Smaller particle sizes result in larger RIC vol % for the same infill vol %. Atomistically distributed particles should result in complete RIC vol % coverage. In FIG. 6, 610 shows fraction of volume affected to RIC generating particles in the host material as determined by running simulations of randomly generated distributed particles of 5 micron diameter, 612 shows fraction of volume affected to RIC generating particles in the host material as determined by running simulations of randomly generated distributed particles of 10 micron diameter, 614 shows fraction of volume affected to RIC generating particles in the host material as determined by running simulations of randomly generated distributed particles of 15 micron diameter, 616 shows fraction of volume affected to RIC generating particles in the host material as determined by running simulations of randomly generated distributed particles of 20 micron diameter, 618 shows fraction of volume affected to RIC generating particles in the host material as determined by running simulations of randomly generated distributed particles of 25 micron diameter, and 620 shows fraction of volume affected to RIC generating particles in the host material as determined by running simulations of randomly generated distributed particles of 30 micron diameter.

FIG. 6 shows statistical distributions for varying particle sizes at 4 vol % infill within a PbTe POLAR foot. As can be observed from this plot the particle size effects the RIC vol % infill fraction, with smaller particle sizes helping to distribute the RIC influenced areas throughout the material. As the particle size decreases, the RIC infill percent reaches its maximum value. With atomistic distribution, virtually the entire sample should be under RIC influence. This should be the case for the various borides and boron compounds that have been identified as potential POLAR materials.

Figure 7:
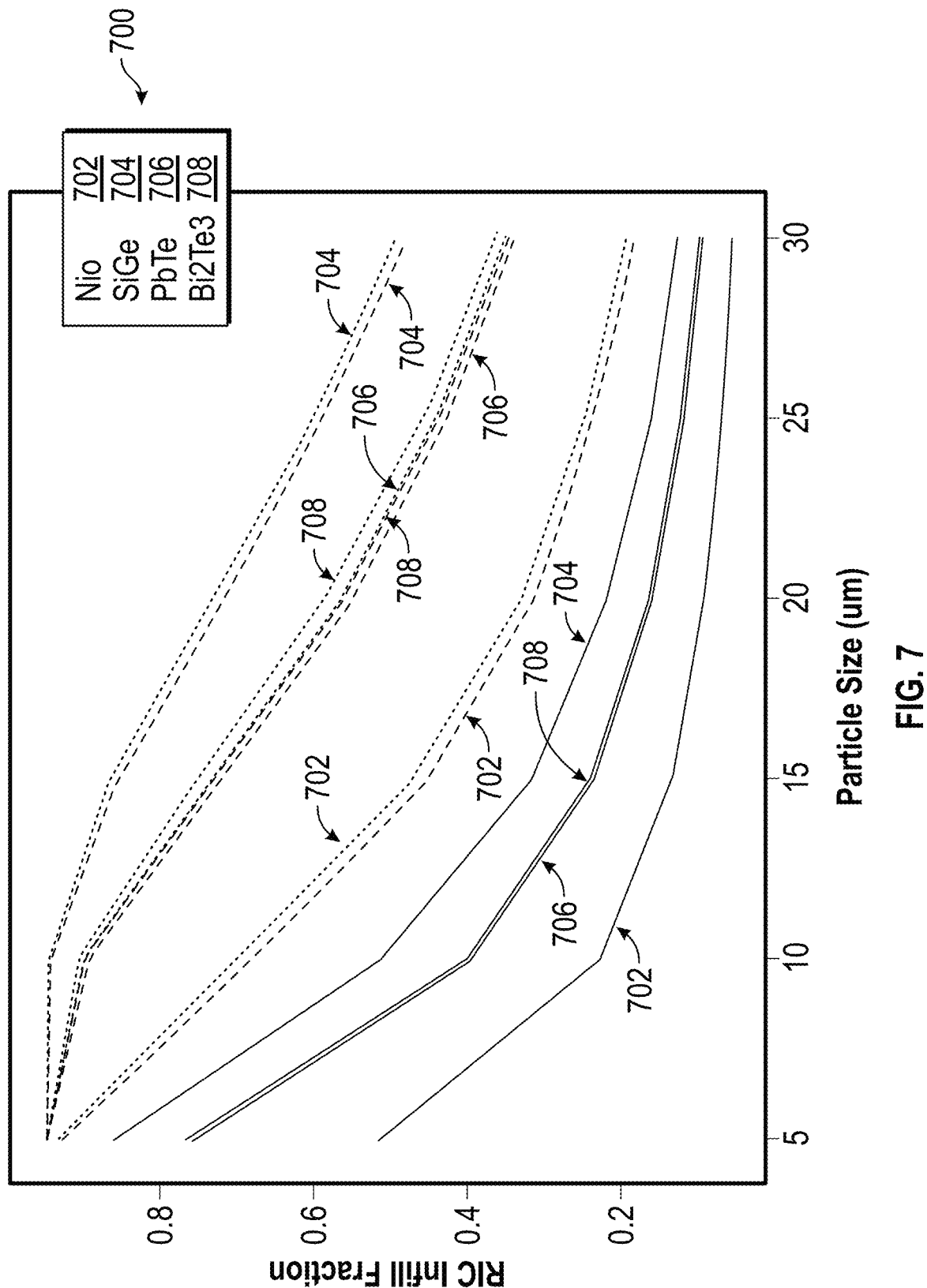
FIG. 7 illustrates a chart showing particle size, alpha source type, and POLAR foot type effect on RIC vol % infill fraction.

The same simulation was performed on various thermoelectric materials to study their behavior with various vol % infills, alpha sources, and particle sizes, which is visible in FIG. 7.

FIG. 7 illustrates chart 700 showing particle size, alpha source type, and POLAR foot type effect on RIC vol % infill fraction, according to various exemplary embodiments. Solid lines represent 10B(n,α) particles, dashed lines represent 241 Am particles, and dotted lines represent 238Pu particles. FIG. 7 shows how the actual POLAR foot material can affect the RIC coverage compared to others, which may be a factor in the decision to choose specific materials over one another to SPS with the alpha particle sources. The plot of FIG. 7 shows that 238Pu and 241 Am effect the material in a similar fashion, with the difference being the specific activity of each radioisotope. While this simulation was conducted on TEC materials at 4% infill, higher infill percentages see much larger RIC vol % infill fractions, particularly with 10B(n,α). In FIG. 7, 702 shows the fraction of volume affected by RIC generated particles in a NiO host material as a function of RIC generating particle size, 704 shows the fraction of volume affected by RIC generating particles in a SiGe host material as a function of RIC generating particle size, 706 shows the fraction of volume affected by RIC generating particles in a PbTe host material as a function of RIC generating particle size, and 708 shows the fraction of volume affected by RIC generating particles in a Bi2Te3 host material as a function of RIC generating particle size.

Determining the impact on the efficiency of the thermoelectric generator uses the RIC vol % infills determined from these simulations. When these particles are introduced to the POLAR matrix, they affect the electrical conductivity, Seebeck coefficient, and thermal conductivity. As discussed earlier, the electrical conductivity is affected the most by radiation, while the thermal conductivity and Seebeck coefficient increase but maintain the same magnitude. The particles introduced have their own electrical conductivity and thermal conductivity which can influence the new composite properties in potentially negative ways. Boron for example has a thermal conductivity of 27 W/mK, which is an order of magnitude higher than the POLAR materials shown in FIG. 7.

The addition of boron particles increases the overall thermal conductivity of the material which can negatively affect the performance of the POLAR. Pu and Am do not suffer as much from this issue as their thermal conductivities, while greater than most thermoelectric materials, are still the same order magnitude as the POLAR feet. The effects of adding the filler material were taken into consideration to determine any negative effects.

Figure 8:
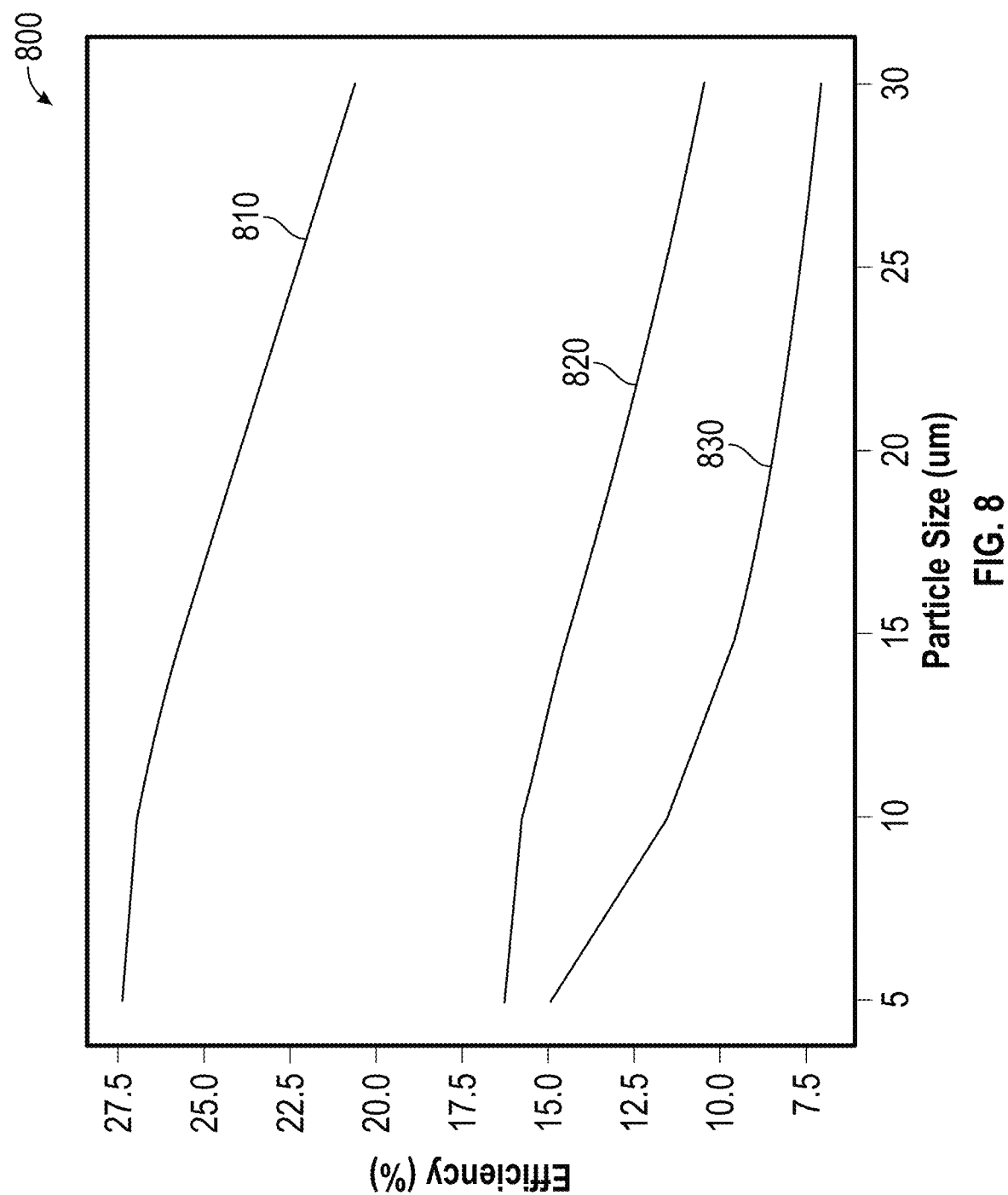
FIG. 8 illustrates a chart showing predicted PbTe enhanced efficiency due to alpha sources within its material matrix.

FIG. 8 illustrates chart 800 showing predicted PbTe enhanced efficiency due to alpha sources within its material matrix, according to an exemplary embodiment. Line 810 represents 238Pu, line 820 represents 241 Am, and line 830 represents 10B particles. In one example, plutonium has a higher activity level than the other sources therefore resulting in a greater change in conductivity in its influenced area.

The degree of conductivity changes is under investigation as significant information over a range of materials is not available. Because plutonium decays at a faster rate than americium, the plutonium makes more alpha particles per second, makes more ionizations, and explains why the Pu line has higher efficiency as shown. However, an experiment at Oak Ridge National Laboratory (ONRL) observed an increase of 400× in the electrical conductivity of alumina when exposed to ionizing radiation at temperatures within the operating range of exemplary embodiments detailed herewithin. Another experiment on ceramic materials observed over 10,000 times increase in electrical conductivity in a UV grade sapphire sample inside a reactor core (for additional information, see https://www.sciencedirect.com/science/article/abs/pii/S0022311598003006). In at least one exemplary embodiment detailed herein, boron nitride showed a 50× increase in electrical conductivity when subjected to a neutron flux in a TRIGA reactor. A conductivity multiplier factor can be applied to the material's electrical conductivity to simulate the expected change in properties during experimental determination of additional materials.

The efficiency and figure of merit of the POLAR is determined from equations 2 and 3 with modifications to the thermal and electrical conductivities due to the particles' effects. These results are visible in FIG. 8 for a lead telluride sample with the three alpha sources studied. Efficiencies were calculated for a standard temperature at 600 K for the hot side and 350 K for the cold side. As observed earlier smaller particles have a greater effect at increasing the electrical conductivity and therefore the efficiency. The activity of 238Pu is roughly five times greater than that of 241 Am for an equivalent mass. This means that the material around the 238Pu shows a higher dose, which is directly linked to the conductivity multiplier.

The activity of 10B is dependent on the neutron source flux, in this case the radioactivity matched that of 241 Am. FIG. 8 shows this relationship with 238Pu having a greater efficiency due to its higher electrical conductivity. In this case, a conductivity multiplier of 10 was used to simulate the effects of RIC. FIG. 8 shows that plutonium has a greater effect on increasing efficiency because of its increased reactivity, while the other two alpha sources show lower activity levels. Because of the lower RIC vol % infill, $10_B$(n,α) did not match that of 241 Am, which had a higher vol % coverage.

Figure 9:
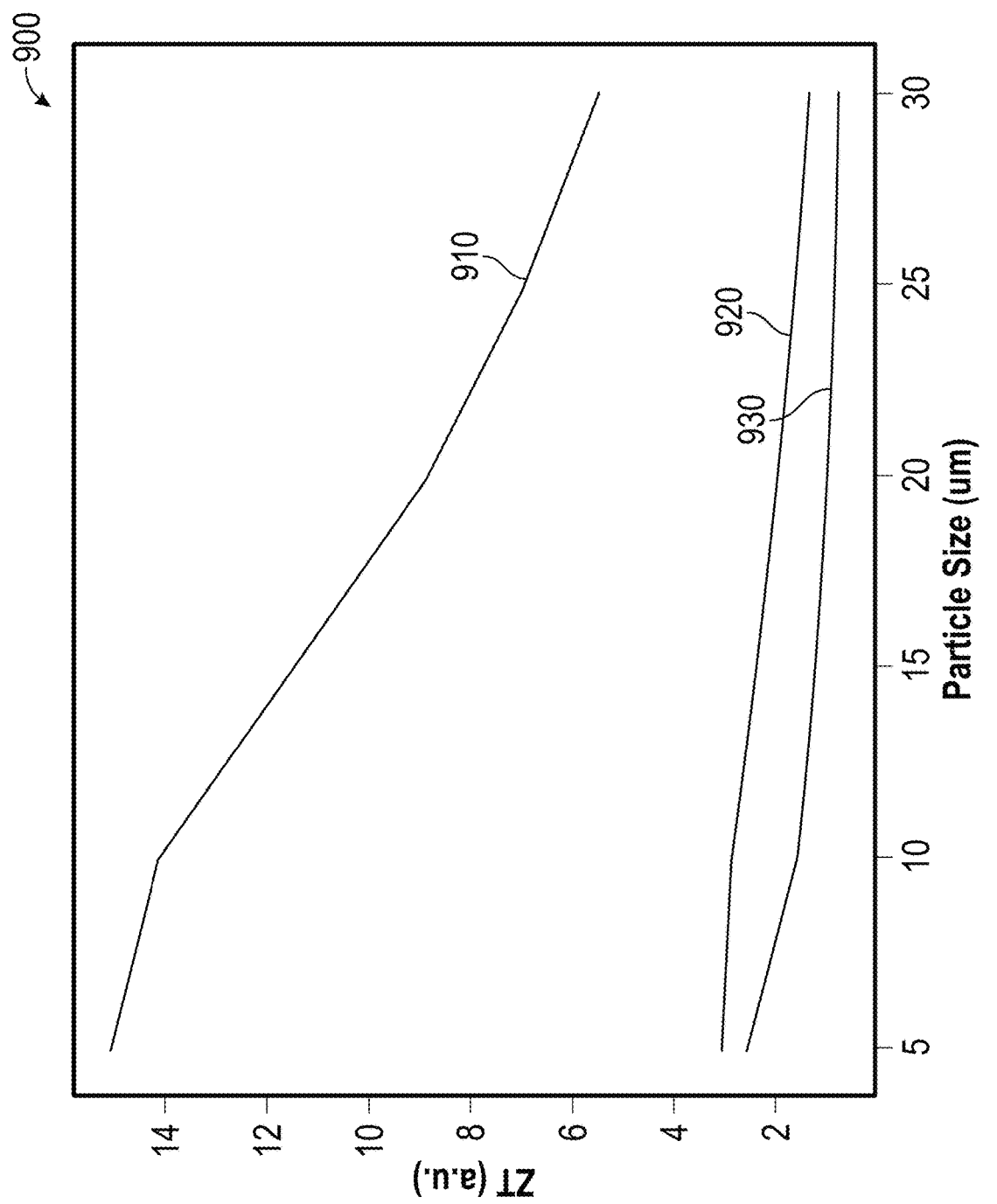
FIG. 9 illustrates a chart showing figures of merit associated with the POLAR created from PbTE materials with the alpha source particles.
Figure 10:
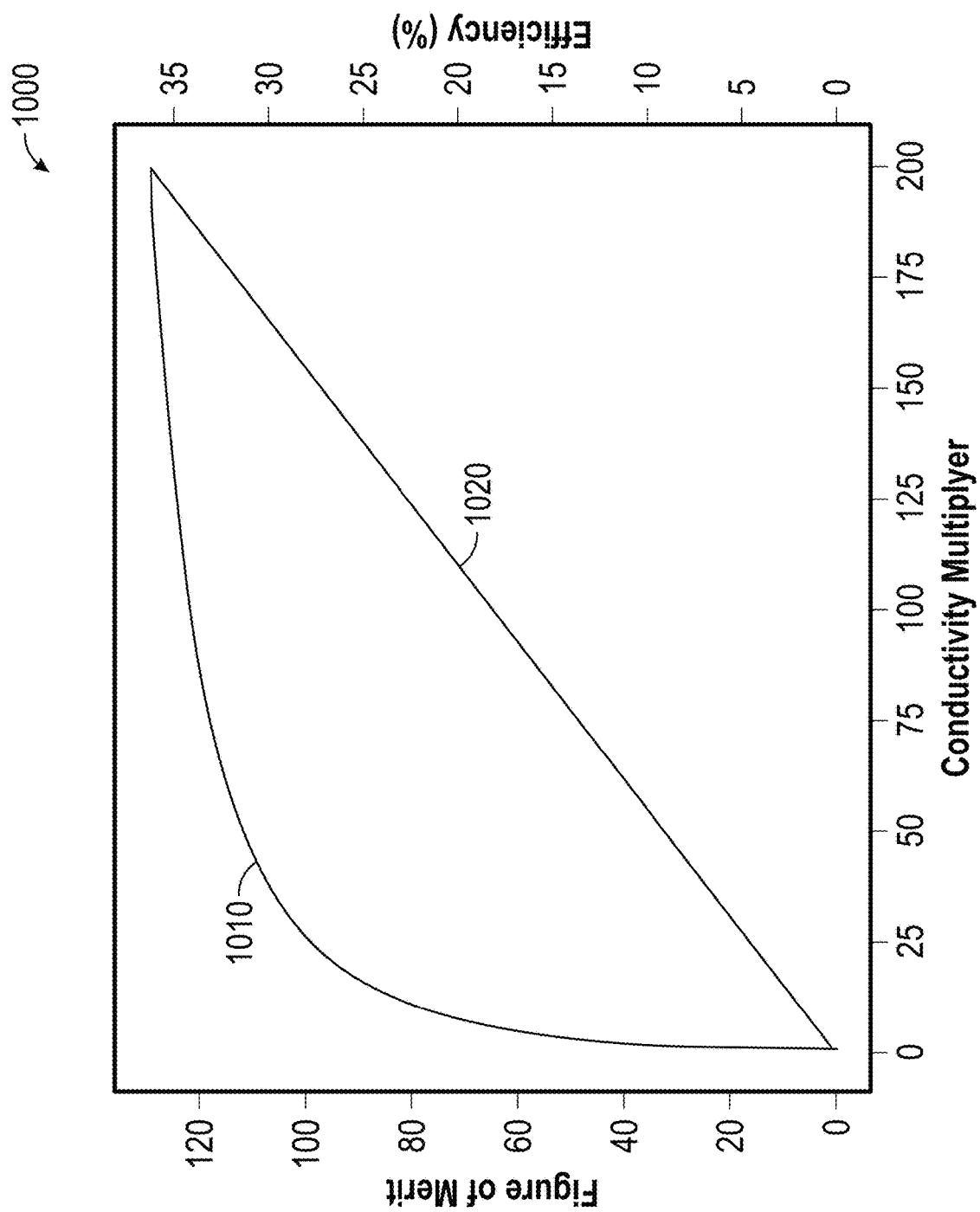
FIG. 10 shows conductivity multiplier plotted against change in figure of merit and the efficiency of a PbTe-PbTe POLAR.

FIG. 9 illustrates chart 900 showing figures of merit associated with the POLAR created from PbTE materials with the alpha source particles, according to an exemplary embodiment. Reaching higher levels of efficiency requires larger figures of merit. FIG. 10 illustrates chart 1000 showing increases in efficiency and figure of merit occur at relatively small changes in conductivity and shows expected PbTe TEG performance with magnitude cond. change. FIG. 9 shows the associated figures of merit for the POLAR couple showing that significantly larger figures of merits can be reached than previously possible through conventional TEG technologies, even though the conductivity multiplier used to simulate this POLAR was significantly lower than that of previous studies on other materials. Where the ZT references above for most materials show a ZT around 1 as the common standard, while the chart shows Pu doped POLARs reaching ZT values of 14. As shown in FIG. 9, line 910 represents 238Pu, line 920 represents 241 Am, and 930 represents 10B particles. The ZT value is plotted in FIG. 9 versus the size of particles of those materials added to the TEG foot as a dopant.

This multiplication factor would coincide with a large dose of radiation. Radioisotope particles may have a continued dose rate that slowly decays over time in conjunction with their half-life. Meaning that they may never exceed the expected efficiency based on their conductivity multiplier and their RIC coverage area. With a (n,α) particle such as 10B, the dose rate can be increased and decreased depending on the desired efficiency. This is because the alpha particle dose is dependent on the neutron flux, which can be adjusted inside of the reactor. Simply increasing and decreasing the neutron flux may change the electrical conductivity of the POLAR which would not be possible with a constant radiation source such as radioisotopes.

Figure 11A:
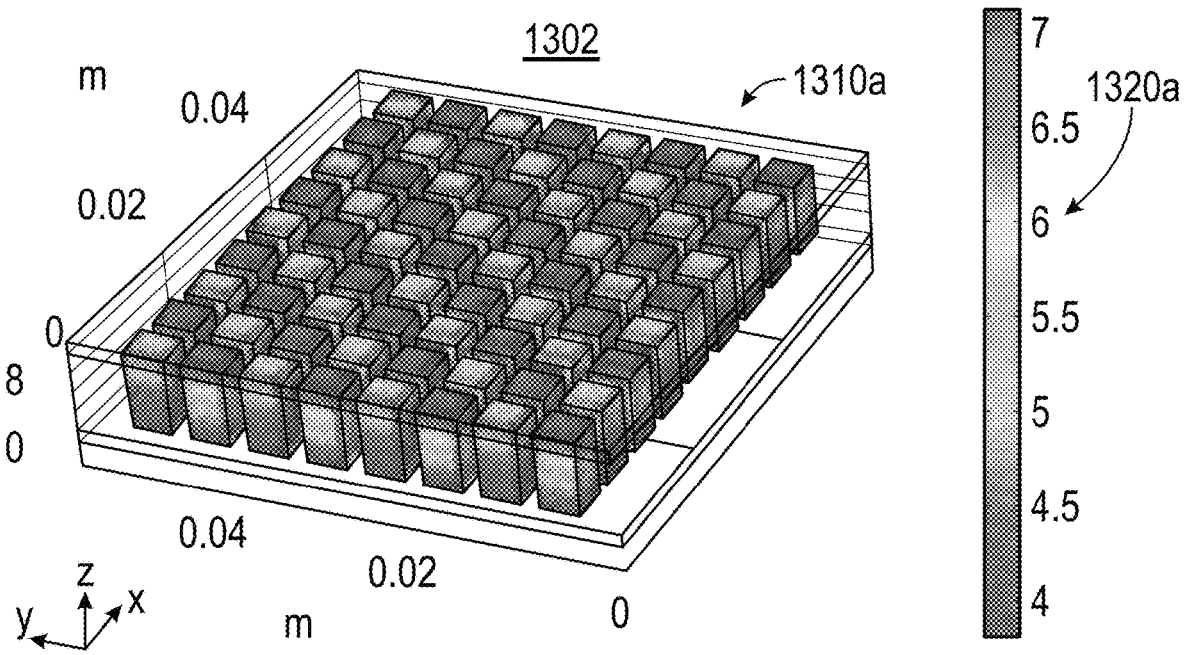
FIGS. 11A through 11C illustrate COMSOL simulations of a bismuth telluride (Bi2Te3) p-type and n-type POLAR with applied conductivity changes ranging from 5 to 100.
Figure 11B:
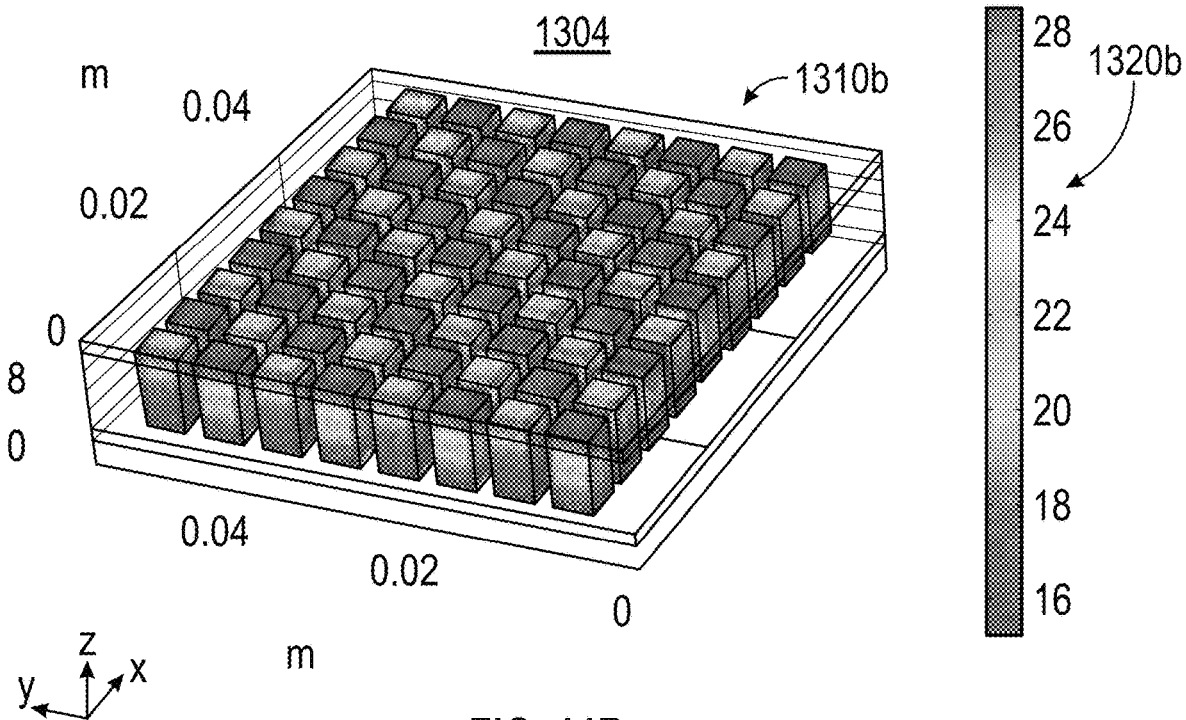
Figure 11C:
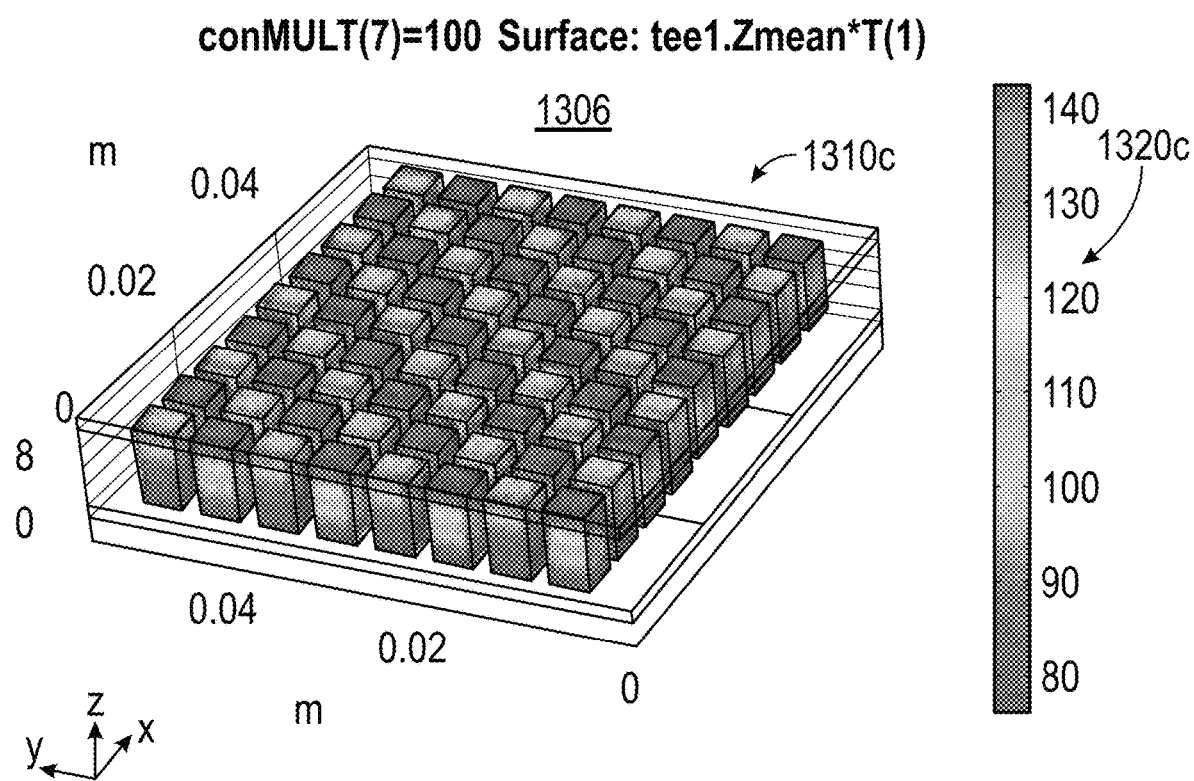

FIGS. 11A-C illustrate COMSOL simulations 1302-1312 of a bismuth telluride ($Bi_2Te_3$) p-type and n-type POLAR with applied conductivity changes ranging from 5 to 100. Large increases in figure of merit and the efficiency can be seen in the figure with the figure of merit (ZT) being shown on the top three images of FIGS. 11A-C. Figure of merit for a 5 times conductivity multiplier of the electrical conductivity of the material is shown at 1302 with scale 1320*a* showing values for various areas and showing maximum values of change of 7 in the image. Figure of merit for a 20 times conductivity multiplier of the electrical conductivity of the material is shown at 1304 with scale 1320*b* showing values for various areas and showing maximum values of change of 28 in the image. Figure of merit for a 100 times conductivity multiplier of the electrical conductivity of the material is shown at 1306 with scale 1320*c* showing values for various areas and showing maximum values of change of 140 in the image. The maximum values change from 7 to 28 to 140 in the three images. Thus, the ZT value for each multiplier increases well beyond the ZT values of any other material.

Experimental Results

Experiments were conducted to validate radiation induced conductivity in potential thermoelectric materials. While the most heavily documented RIC cases have involved aluminum oxide and other insulators, none of them contained 10B for an alpha source. Boron nitride (BN) was chosen as the material to be tested for its potential to demonstrate the key concept of the (n,α) source, and that it is considered a wide band gap insulator. Within the BN, 20% of the boron content would comprise 10B which should have a uniform distribution throughout the compound. A TRIGA Mark II Nuclear Research Reactor at Kansas State University (KSU) was used as a neutron source to generate the alpha particles. Leads were attached to the BN sample to take insitu conductivity measurements while the reactor was being operated. Contained within a polyethylene container, the BN sample was subjected to the neutron flux at various power levels to determine its resistive response.

Figure 12:
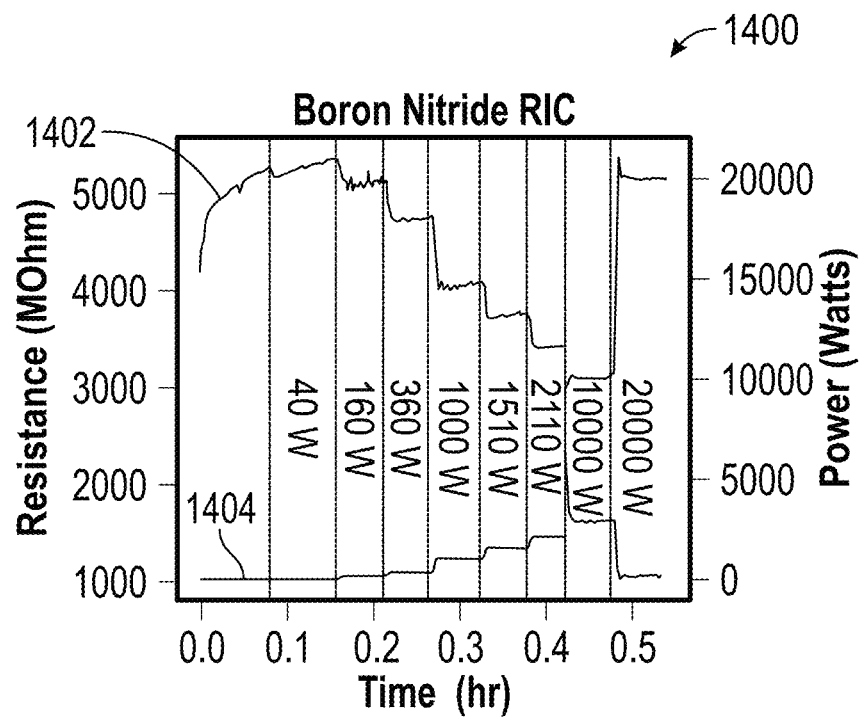
FIG. 12 illustrates a chart showing Boron Nitride resistance effects due to neutron flux from nuclear reactor.

FIG. 12 illustrates chart 1400 showing Boron Nitride resistance effects due to neutron flux from nuclear reactor. Clear dependence on neutron flux is shown as resistance decreases with increases in power. This is evidenced, for example, as the neutron flux in the reactor increases proportionately to the power of the reactor. As the reactor power increases, so does the neutron flux to which the sample is exposed. The chart shows the electrical conductivity decreasing every time the power of the reactor is increased. FIG. 12 shows the power between 0 W to 20 kW of thermal power. An insulation resistance meter was utilized to determine the resistance of the material. The initial resistance of the sample was just over 4 GΩ and slowly rose to above 5 GΩ before the RIC effects were visible. This effect is visible in FIG. 12 with power intervals marked between dashed lines. Insulators typically exhibit an increase in resistivity as they are measured from capacitive effects which was observed during this experiment and previous experiments observed without a neutron flux. An initial decrease in resistance is observed as the reactor is stepped up to 40 Watts. As the reactor power increases to 160 Watts, a more noticeable drop in resistance is visible. This trend continues as the power/neutron flux increases. Larger jumps in resistance appear to be more prevalent at lower increases in power. As shown in FIG. 12, 1402 shows resistance values of boron nitride as a function of time during a test that gradually increased reactor power and dose to the material and 1404 shows reactor power as a function of time.

Figure 13:
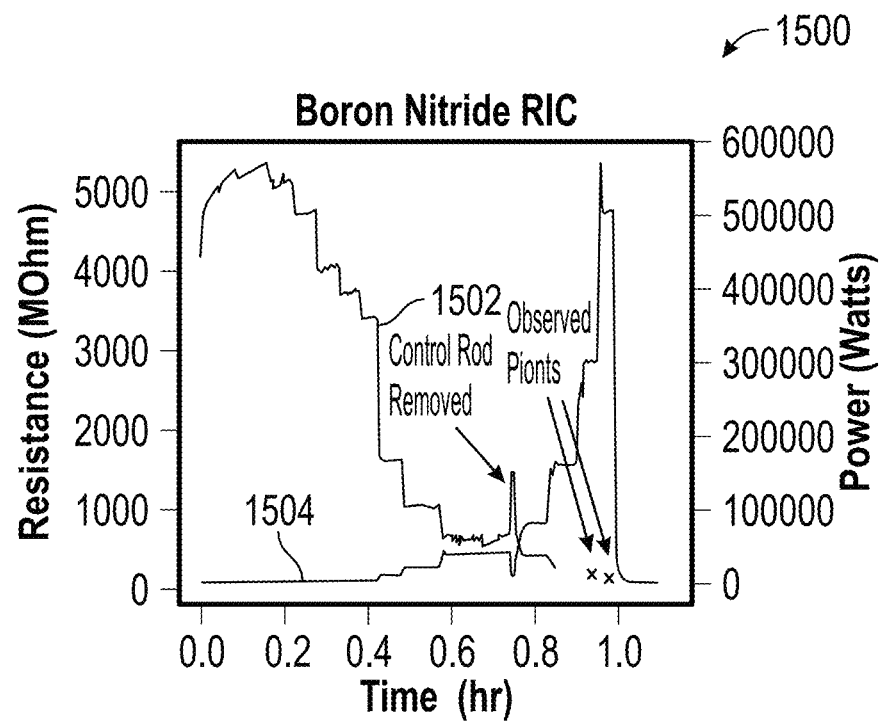
FIG. 13 illustrates a chart showing Boron Nitride complete test up to ½ Mega-Watt (MW) power level observing ~50 times conductivity multiplier.

FIG. 13 illustrates chart 1500 showing Boron Nitride complete test up to ½ Mega-Watt (MW) power level observing ~50 times conductivity multiplier. Previous data shows that a 50 times conductivity multiplier is more than suitable to significantly change the performance of a POLAR. Boron Nitride was tested up to ½ MW to determine the POLAR's resistance response at this power/flux level. As shown in FIG. 13, at 1502 resistance values of boron nitride as a function of time during a test that gradually increased reactor power and dose to the material and at 1504 reactor power as a function of time. As shown in FIG. 13, the entire test was conducted over the course of one hour. After the reactor reached a level of 20 kW and was held for a short period of time, a control rod was removed as the reactor was ramped up to 40 kW. This caused a decrease in reactor power which also resulted in an increase in conductivity. This again shows an extremely responsive relationship to the reactors power level/neutron flux. Power levels were increased again to 80 kW, 160 kW, 300 kW and finally 540 kW. During this time the resistance meter stopped recording but continued to display resistance. Personnel, except the reactor supervisor, were stationed inside of the control room and away from the meter and were unable to manually restart it. However, the reactor supervisor relayed data points at 300 kW and 540 kW, which were 183 MOhm and 140 MOhm respectively. These points have been marked on FIG. 13 to show their respective position at that power level. It is clear from these plots that the increase in conductivity is not linear with the increase in power. At smaller activity levels within the reactor, there were larger gains in conductivity observed. This shows that large changes in conductivity are likely especially at power/flux levels that the SPEAR reactor may produce. While BN is not typically used as a thermoelectric material, there have been several studies that show its potential.

Although the 400-10,000× increase in electrical conductivity was not observed by the BN in this experiment, there was at least a ~50× increase in electrical conductivity observed. Referencing FIG. 13, this slight increase in conductivity could be enough to reach efficiency values greater than 20% depending on other material properties.

POLAR Materials

Many of the thermoelectric materials described in the sections above must be created via spark plasma sintering (SPS) if they are to be created with the radioisotope or the (n,α) if not already embedded within the material. However, several thermoelectric materials with 10B(n,α) have already been studied and can be obtained for future experiments. A few thermoelectric materials containing BN in the form of quantum dots, thin films, and nano-ribbons/tubes have been studied. This is advantageous as our BN based system takes bulk BN material and increases its electrical conductivity significantly.

Figure 14:
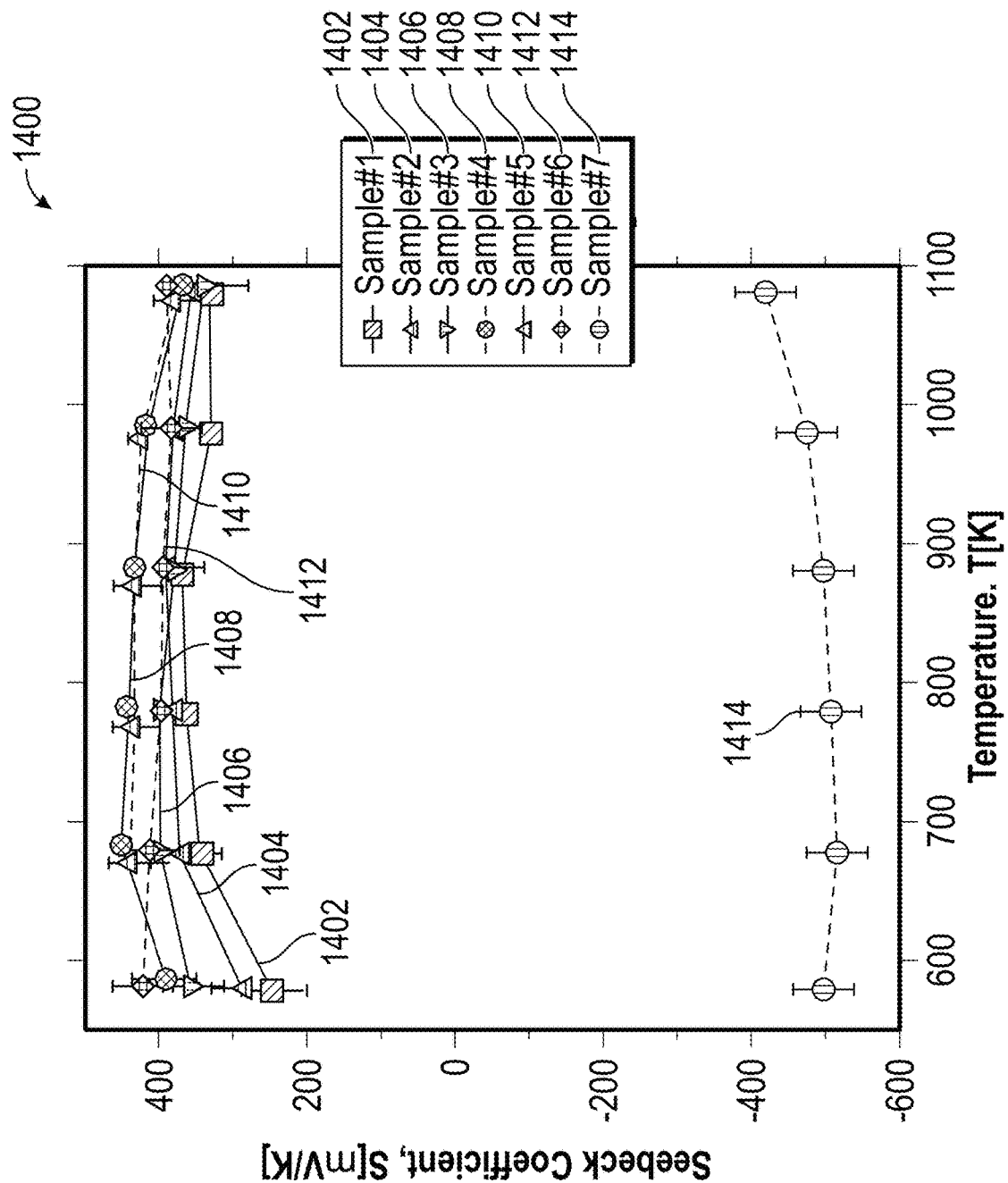
FIG. 14 illustrates a chart showing Seebeck coefficient of boron based thermoelectric materials.
Figure 15:
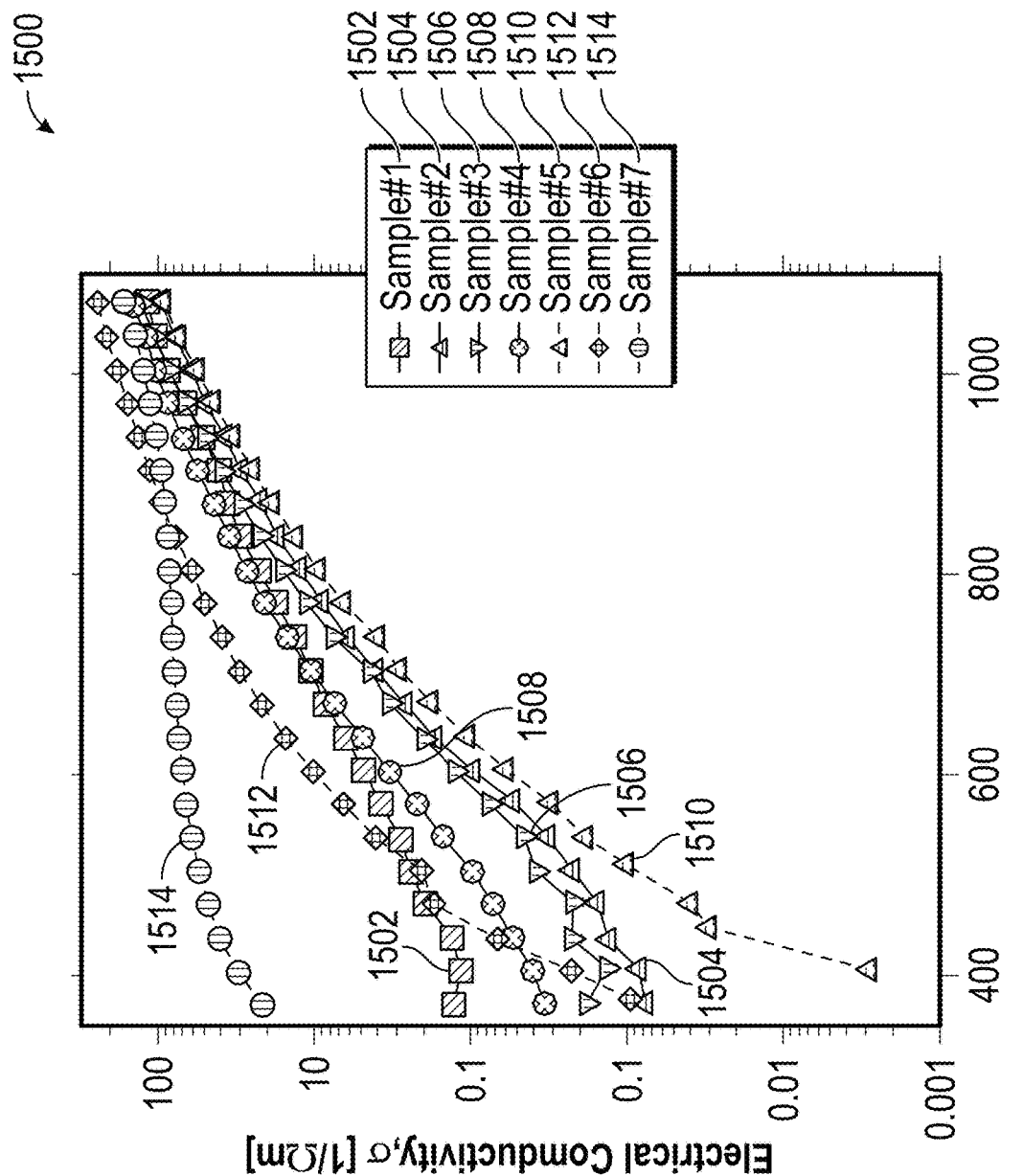
FIG. 15 illustrates a chart showing response of electrical conductivity of showing boron based thermoelectric materials.

FIG. 14 illustrates chart 1700 showing Seebeck coefficient of boron based thermoelectric materials shown as sample numbers 1702, 1704, 1706, 1708, 1710 1712, 1714. These materials are predicted to behave exemplary when augmented with RIC. FIG. 15 illustrates chart 1800 showing response of electrical conductivity of showing boron based thermoelectric materials shown as sample number 1802, 1804, 1806, 1808, 1810, 1812, 1814. A ZT of 2.5 is possible with graphene/h-BN (hexagonal BN) superlattice monolayers. If the changes in conductivity observed from the KSU experiment hold true for BN to this superlattice, a ZT potential of greater than 100 is theoretically possible. In another study conducted by Algharagholy et al. involving graphene-boron nitride hetero-structures of various widths a ZT value of 0.9 was theoretically possible. It would appear that despite BN's poor bulk thermoelectric properties, their use inside the technologies above can increase ZT values to usable levels, and potential RIC behavior cross over to these materials can accelerate these values beyond what was previously thought possible. The current record ZT value of 7.4 was measured in hybrid MoS2/MoSe2 nanoribbons at 800K by Ouyang et al. The disclosed POLAR technologies and projections with BN alone would significantly pass this record.

Other materials containing boron have been extensively studied for their potential use in thermoelectric generators. Many of them are on the cusp of high ZT values, most being held back by lower than average electrical conductivities for thermoelectric materials. One such material, AlMgB14 has been shown to have high Seebeck coefficients and moderate electrical conductivities based on its mixture ratios. Miura et al. has shown that AlMgB14 can reach Seebeck coefficients in upwards of 250-450 µV/K which is competitive with most thermoelectric materials. Through slight changes in material composition during the SPS process, Miura et al. was able to create an AlMgB14 sample with a −500 µV/K Seebeck coefficient—meaning that a POLAR could be created with virtually the same material, limiting issues with thermal expansion coefficients and other stresses that the POLAR might endure with varying POLAR feet. The varying Seebeck Coefficient and electrical conductivity is visible in FIGS. 14-15 (for additional information, see S. Miura, H. Sasaki, K.-i. Takagi and T. Fujima, "Effect of varying mixture ratio of raw material powders on the thermoelectric properties of AlMgB14-based materials prepared by spark plasma sintering," Journal of Physics and Chemistry in Solids, vol. 75, no. 8, 2014.). The Seebeck coefficients are very high for alumina, however, the electrical conductivity is much lower compared to traditional thermoelectric materials such as PbTe and SiGe. While the electrical conductivity restricts the efficiency of alumina, it has been shown that slight changes in its composition can have drastic changes in these levels. Combined with RIC enhancing effects, this could result in a much higher efficiency and ZT value. AlMgB14 is also advantageous in that the materials are not considered rare earth borides (REB) making production cheaper and more sustainable on a larger scale.

While AlMgB14 has a great potential for thermoelectrics at a sustainable and economical price point, there are several other REBs that sit on the cusp of advancing thermoelectric technologies. Materials identified with the greatest potential for POLAR feet include ErB44Si2, YB66, YB44Si2, SmB60, SmB62, TbB44Si2, and ErB66. The thermoelectric properties of these materials can be found in TABLE 2. While these materials are not currently considered high performing TECs, with modification to their electrical properties via RIC they can reach high ZT values making them promising candidates for POLARs. Embodiments further contemplate lithium- or sulfur-containing materials which absorb neutrons and emit ionizing radiation. Fission products or other elements which emit alpha, beta, gamma, neutron, or other ionizing radiation may also be used to induce the RIC.

TABLE 2

| Material | Seebeck Coefficient | Thermal Conductivity | Electrical Resistance |
|---|---|---|---|
| $ErB_{44}Si_2$ | 50-220 [37] | 1.6-2.7 [37] | 0.0087-135 [38] |
| $YB_{66}$ | 205-752 [39] | 2.49-3.74 [39] | 0.0035-157 [39] |
| $YB_{44}Si_2$ | 80-200 [38] | ~2.7 [38] | 9e-4-0.02 [38] |
| $SmB_{60}$ | 197-567 [39] | 2.53-3.17 [39] | 1.33e-4-0.332 [39] |
| $SmB_{62}$ | 207-557 [39] | 2.06-2.76 [39] | 1.54e-4-0.625 [39] |
| $TbB_{44}Si_2$ | 70-140 [38] | ~2.7 [38] | 9e-4-0.0045 [38] |
| $ErB_{66}$ | 200-700 [38] | ~2.7 [38] | 0.0085-207 [38] |

TABLE 2 shows material properties for various rare earth borides that can potentially be used as advanced thermoelectric generators, with Seebeck coefficient in V/k, Thermal conductivity in w/m*k, electrical resistance in Ohm*m. These materials are mostly held back due to their higher electrical resistivity compared to traditional TEC materials. It is predicted that they may behave more like an insulator than traditional TEC materials so changes in conductivity should be more noticeable. Small changes in conductivity are enough to achieve noticeably large increases in efficiency. As shown in TABLE 2, bracketed reference [37] is T. Mori, "High Temperature Boron-based Thermoelectric Materials," *Material Matters*, vol. 4, no. 2, 2011, bracketed reference [38] is T. Mori, "High temperature thermoelectric properties of B12 icosahedral cluster-containing rare earth boride crystals," *Journal of Applied Physics*, 2005, and bracketed reference [39] is A. Sussardi et. al, "Enhanced thermoelectric properties of samarium boride," *Journal of Materiomics*, vol. 1, pp. 196-204, 2015.

The Peltier with Optimized Levels of Alpha Radiation (POLAR) is an advanced Peltier cooler which is greatly enhanced by embedding a small amount of alpha emitting radioisotope in the feet of the device. The amount of material is small enough to avoid changing the bulk properties of the material, but the radiation it emits will ionize atoms in the feet and create free electrons. The effect of this ionization is known as "radiation enhanced conductivity," and drastically increases the electrical conductivity of a material. This is particularly valuable to Peltier coolers, which rely greatly on the thermal and electrical conductivity values of their constituent materials.

Peltier cooler performance is modeled by an energy balance comprising the superposition of the thermoelectric effect, resistance heating, and conductive heat transfer. The total heat extracted can be calculated using the equation below.

$$Q_c = (S_m \times T_c \times I) - (0.5 \times I^2 \times R_m) - (K_m \times DT)$$

where S is the Seebeck coefficient, Tc is the cold side temperature, I is the current through the foot, R is the electrical resistance of the foot, K is the thermal conductance, and DT is the temperature difference between the hot and cold sides. The subscript 'm' refers to specific values for the given Peltier module, including geometry. From this equation, it is apparent that high electrical resistivity and high thermal conductivity are detrimental to the performance. Unfortunately, electrically conductive materials are often thermally conductive, and electrically resistive materials are also often thermally resistive.

With the introduction of the radioisotope dopant, the electrical resistivity of a ceramic or other resistive material can be greatly reduced. While normally the electrical resistance would dominate the second term in the equation, it is effectively removed. Because electrically resistive materials are usually thermally resistive as well, the thermal conductance value is also very low and also minimized in the equation.

Figure 16:
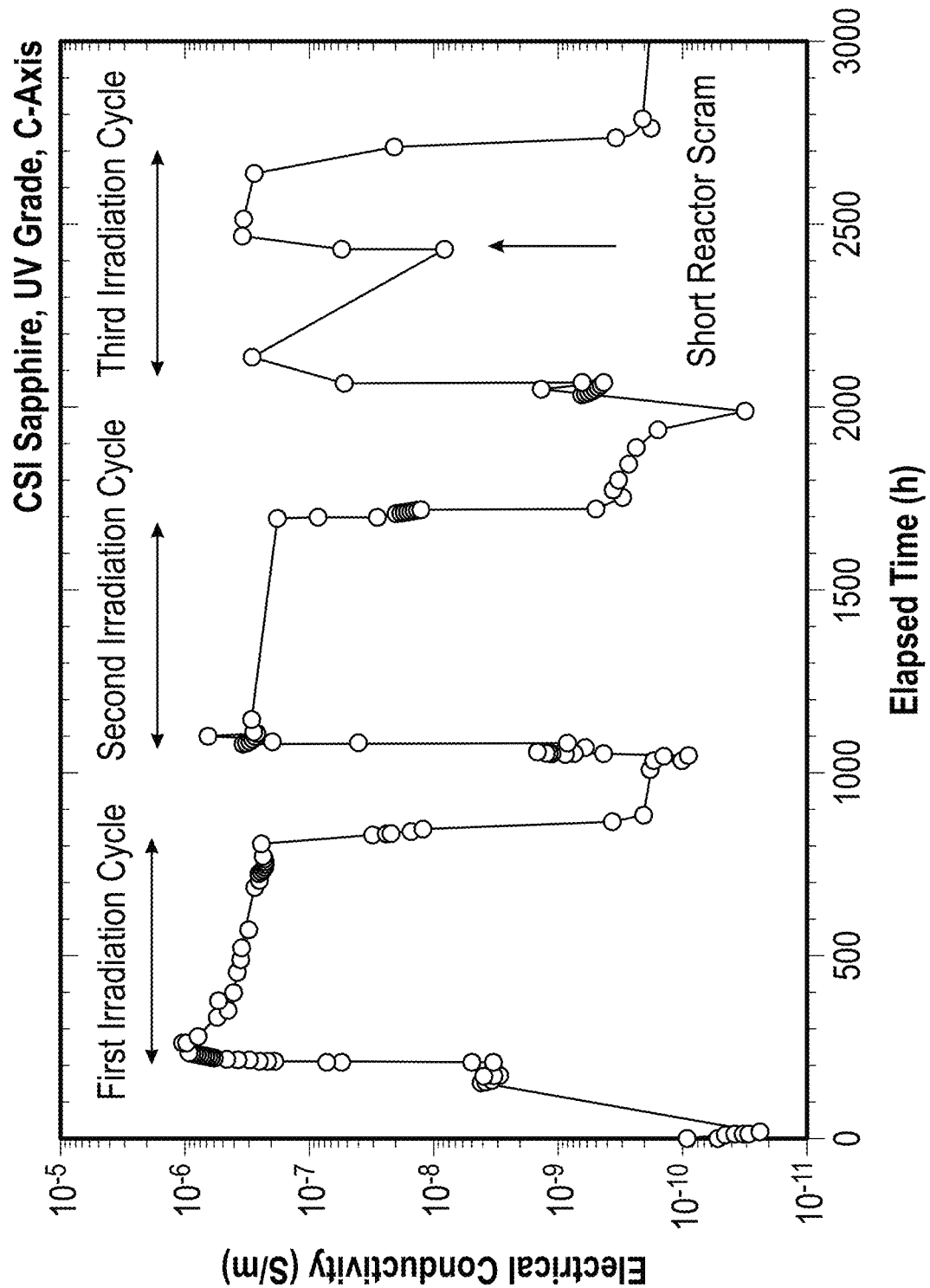
FIG. 16 shows electrical conductivity change of sapphire when exposed to ionizing radiation.
Figure 17:
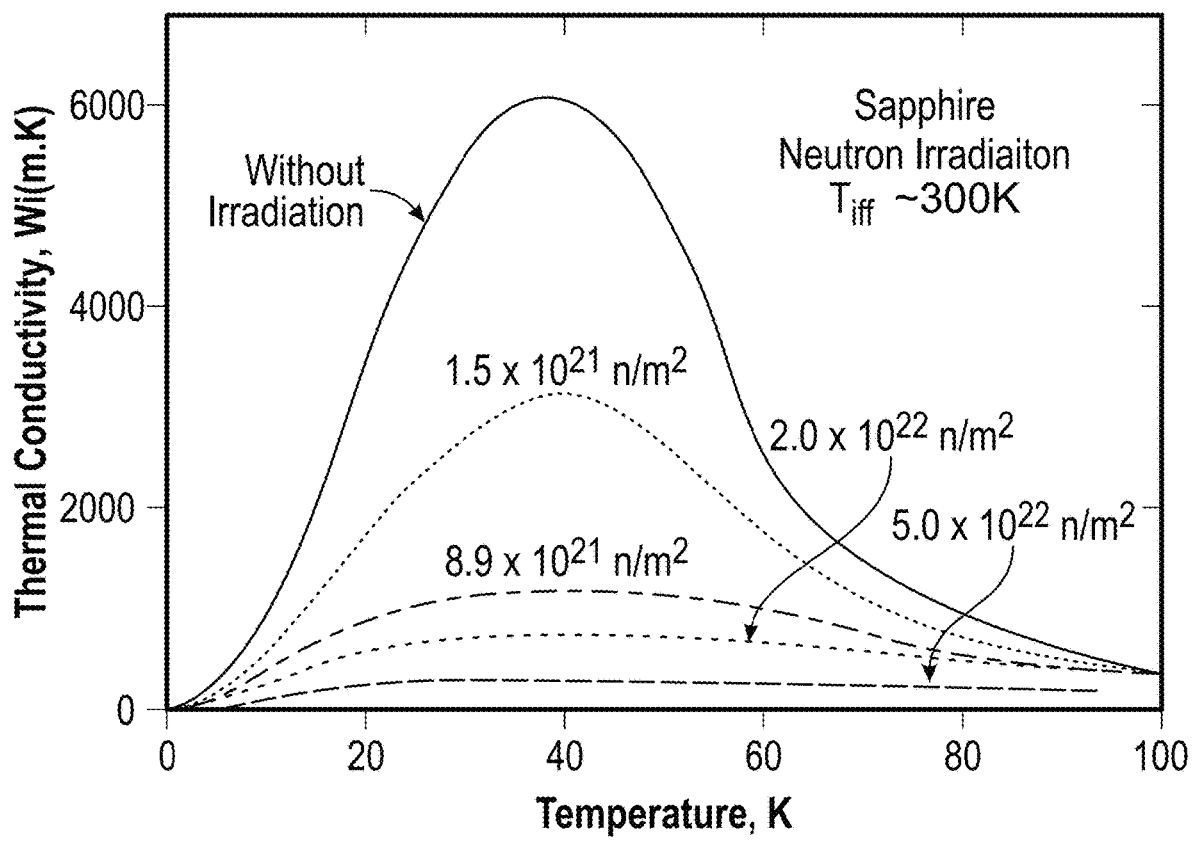
FIG. 17 shows thermal conductivity of sapphire decreasing with increasing doses of radiation.

FIGS. 16 and 17 show how sapphire in a reactor experienced an increase in electrical conductivity of over 1000× when exposed to ionizing radiation. While sapphire is not normally used as a Peltier foot material, it does strongly indicate that other resistive materials will experience a similar effect. The thermal conductivity and Seebeck coeffects have also been shown in experimental tests to behave beneficially as well and can be seen in FIGS. 16 and 17.

Figure 18:
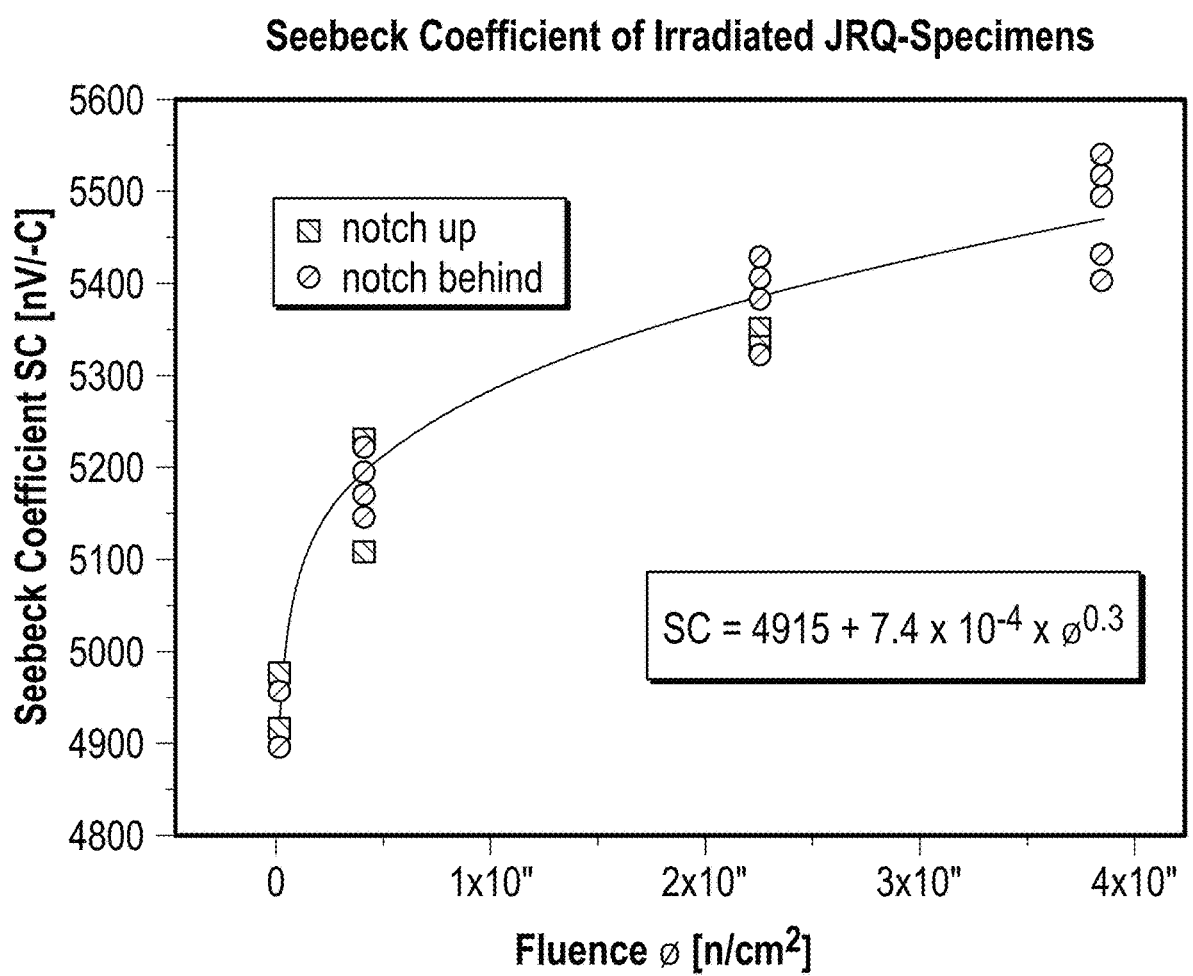
FIG. 18 shows data demonstrating that the Seebeck coefficient of alumina increases with radiation dose.

The Seebeck coefficient is the last material property which impacts the performance of the Peltier cooler, and although there is little research on the topic of Seebeck changes while under irradiation, one example of alumina increasing with dose is present as shown in FIG. 18.

2.0 Preliminary Models

One potential material for use is nickel oxide, (NiO) which is quite electrically resistive but performs well when augmented. Performance of the POLAR device is shown in thermophysical data from NiO taken from the Center for Information and Numerical Data Analysis and Synthesis at Purdue University and combined with work done at Oak Ridge National Laboratory regarding electrical conductivity changes under radiation. The augmented values with the Peltier performance equation are shown to find the heat transferred and COP values.

A POLAR cooling unit with a cold side of 350K and a hot side of 900K could operate with a COP of 0.36, i.e., it would take 1 Watt of electrical power to remove 0.36 Watts of heat from a cooled object and reject it at 550 degrees hotter than the source. As a comparison, current commercially available Peltier units have a COP of ~0.067 over a 50-degree difference (at room temp), and a dynamic Ricor K561 cryocooler has a COP of 0.038. This drastic increase to cooling performance suggests that replacing current units in space could allow for extremely smaller and lighter spacecraft.

Figure 19:
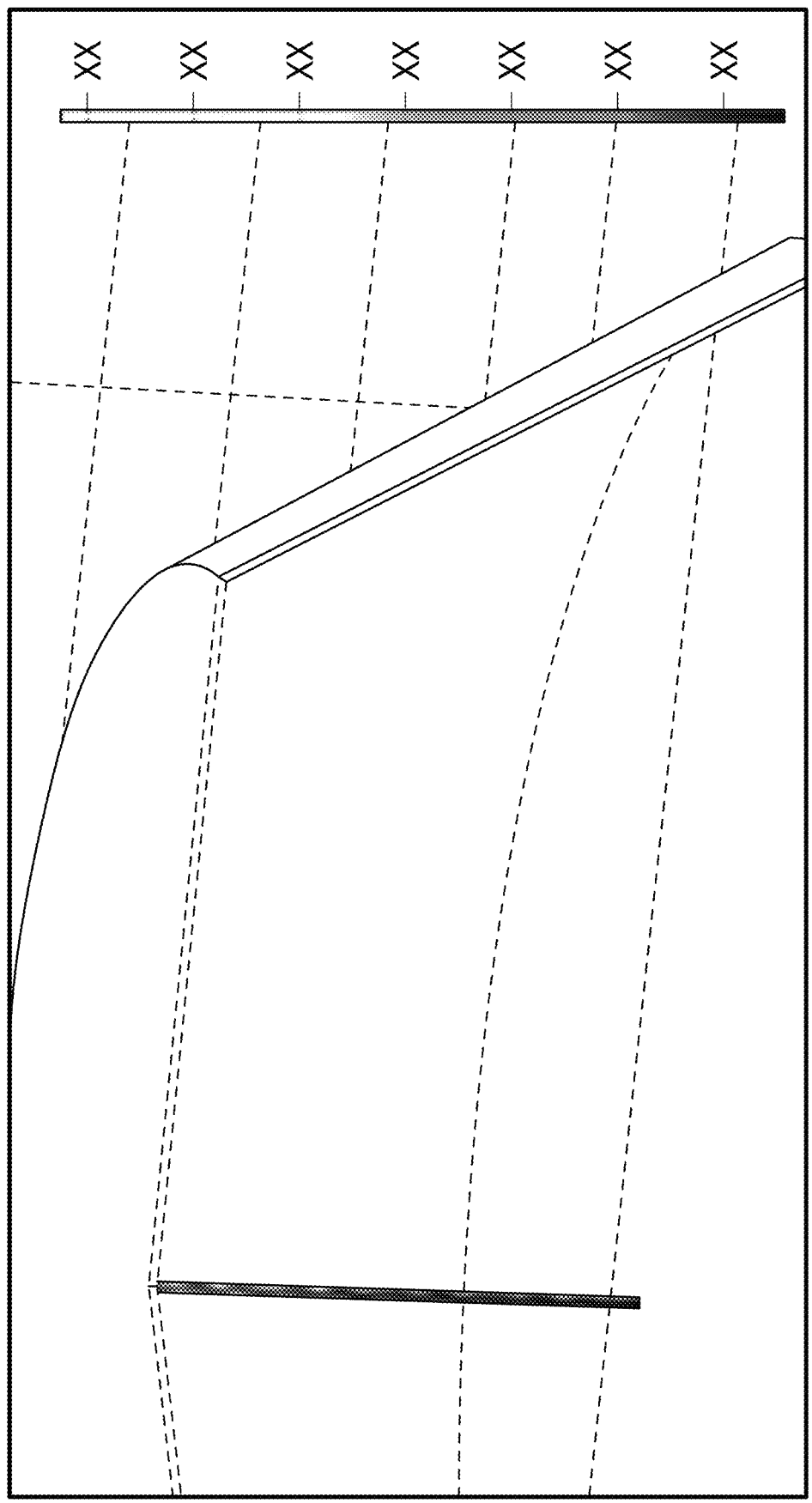
FIG. 19 shows a temperature profile of the HI-POWER shield when exposed to the solar irradiance of Mercury and cooled with the POLAR units in the supporting shaft.

Initial modeling in COMSOL predicts that for an irradiance of 10,000 W/m2 the temperature of the rover can be maintained at ~300K using the POLAR coolers. A simplified design of a tungsten shield was created, and a support structure made of POLAR coolers was used to determine the temperature difference that could be achieved. The connection to the rover could stay at 300K given the predicted performance of the POLAR coolers, as shown in FIG. 19.

This is reinforced by the NIAC POLAR work which demonstrated at a reactor that irradiating boron nitride resulted in a conductivity multiplier of 35×.

2.1 Rover Design

Figure 20:
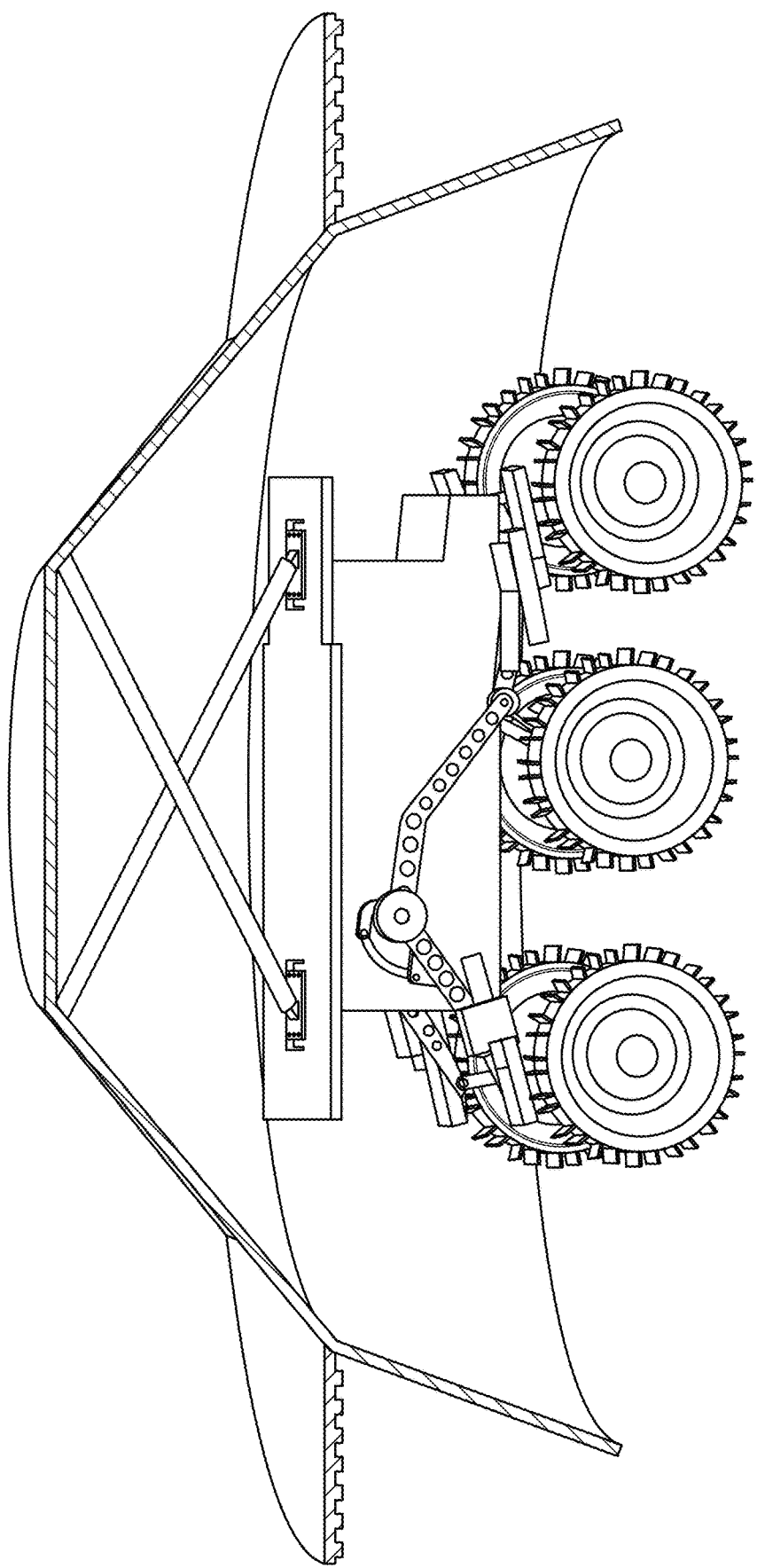
FIG. 20 shows an exemplary HI-POWER rover.

The design of the rover is based on previous Mars rovers and will be relatively small and simple for this mission. As shown in FIG. 20, the rover will be equipped with cameras, radiation detectors, photo arrays, and mass spectrometers to take samples. A small vehicle is shielded from the sun with a tungsten shield. The connections to the shield are comprised of stacked POLAR coolers. The outer skirt of the shield includes arrays of thermoelectric generators which absorb heat from the shield and radiate waste heat to the ground without heating the rover.

Wheels of the rover will need to withstand the hot surface of the planet. The head from conductive transfer as well as radiative transfer will have to be transmitted through the body of the rover and out to the shield where it can be radiated. This will require a thermal model with complex geometry and inputs.

The support of the shield is comprised of stacked POLAR units which work to push heat away from the low temperature rover towards the high temperature shield. The shield will then radiate away the heat. The units may be crossed (as shown) to maximize their length while keeping a low profile, and there may be more supports added as necessary.

The power for the rover is supplied by thermoelectric generators attached to the skirt of the shield. They extract heat from the shield and reject heat radiatively to the ground. This prevents the issue of the HI-POWER rover having to continuously reject the waste heat from its power generation system. Additionally, the high surface area of the shield will provide ample power for the system, and the relatively small surface area of the rover will allow it to pick up minimal re-radiating heat and stay cool.

2.2 Shield Design

Figure 21:
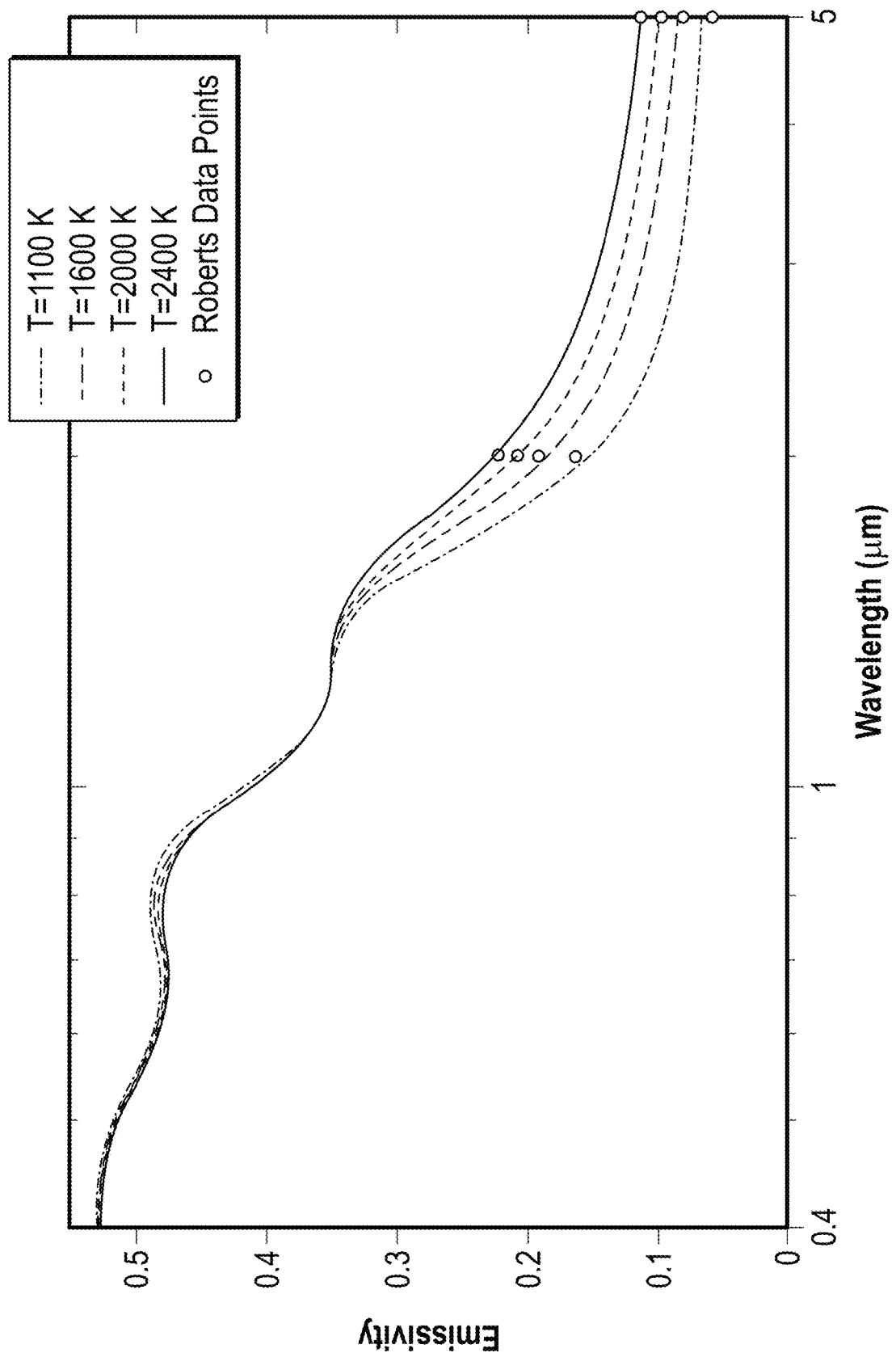
FIG. 21 shows spectral emissivity of tungsten metal.

The shield is comprised of a tungsten can which envelopes the rover as much as possible. A skirt runs around the shield to mount the TEG units for power. The inside of the shield is reflective to prevent radiative heat transfer from heating the rover, while the outside of the shield is absorptive to better radiate waste heat. The surface emissivity of the shield may be modified as a selective emitter with different coating materials if necessary, although tungsten naturally acts as a semi-selective emitter favoring shorter wavelengths. This profile is shown in FIG. 21 and suggests that the temperature of tungsten will be higher than that of a blackbody emitter of similar design, as the tungsten surface will be less able to radiate long wavelengths in the IR range. The low emissivity at long wavelengths will allow the surface to absorb sunlight but will limit the ability to radiate in the IR spectrum.

Having a hot shield due to selective emission and absorption creates a complex issue which must be carefully optimized. The benefits of a hot (~1000K) shield include the fact that the TEG will be able to radiatively reject heat to the surface of the planet, which is expected to reach ~700K. However, the work needed to be done by the POLAR coolers increases due to the high heat rejection temperature. Fortunately, the POLAR system's augmentation allows for high performance to be able to operate under these conditions.

2.3 POLAR Design

The POLAR Peltier unit is comprised of a P leg and an N leg with different Seebeck coefficients. The legs are doped with small amounts of radioactive material to increase electrical conductivity. Current estimates suggest that the legs must be roughly 10% by volume for an Am-241 dopant, or 2% by volume for a Pu-238 dopant. Other dopants may be explored based on cost and effectiveness.

In one exemplary embodiment, the coolers are 10 cm thick each, with a footprint of 1 cm2. They are stacked together in groups of 10. Each POLAR unit is capable of removing ~5 watts of heat and require 1.5 watts to operate. When stacked together, the total assembly requires 15 watts. These stacks will be configured based on the size of the shield (and heat input) the conductive heat through the wheels, the re-radiated heat from the planet, and the reflected light that gets past the shield. Multiple units may be necessary to keep the temperature at acceptable levels. However, this will require more power, and more TEGs, which may affect the absorbed heat and other factors.

2.4 Comparison to Alternatives

Using a refrigeration cycle for thermal management introduces many potential points for failure and does not have the very low weight achieved by the POLAR units. Having high temperature, pressurized gasses would mean more moving parts and more seals and gaskets that might fail under these extreme conditions. Furthermore, the compressor, piping, and full refrigeration system would add extra mass and make the rover too large and heavy to be viable.

Alternative methods for exploring Mercury include going at night and/or staying near the poles. Both of these methods involve hiding from the sunlight and retrieving data that may not be interesting from a scientific standpoint. Even if a nighttime rover could gather geologic information near the equator, it would inevitably melt when the sun came out. Additionally, other rovers would need to carry their power source on board as they could not use the solar flux for power due to the high intensity and the fact that they are designed to avoid the sunlight. Thus, the mission would require an MMRTG or would only be viable for as long as batteries could last.

The HI-POWER rover will be able to operate for extended periods of time, look at sections of the surface in the sun and at night, recharge itself during the day, and perform a multitude of tasks which other options could not. This will not only provide valuable information about the planet closest to the sun, but also demonstrate that humanity is capable of creating technology which in the past would have been thought impossible.

2.5 Mission/Architecture

The rover uses the POLAR cooler and a tungsten shield to allow for exploration of Mercury during the day in full sunlight. The augmented HI-POWER shield will protect the rover through a combination of reflectivity and thermal management. The main shroud of the shield will absorb the incoming sunlight and attempt to limit re-radiation towards the rover below. The shaft will be created with multi junction POLAR units to continuously push the heat away from the rover and towards the shroud.

The mission will include mass and trajectory analysis for a spacecraft to reach the surface of Mercury and deposit the rover. The rover will be largely autonomous, as communications will be limited while the shield is in place. Communications to relay findings will be performed at night when the shield can be lowered and/or communications arrays exposed. Due to the lack of sunlight, the rover will go dormant at night after sending out a report and resume work during the next day (approximately 14 hours later). Fortunately, the solid-state nature of the power conversion system and thermal management systems limit the negative effects of major temperature swings between day and night. Trajectories, communications, work cycles, and other aspects will be investigated to ensure the use of the HI-POWER rover is viable for such an extremely dangerous mission. Additional details can be found in *High Irradiance Peltier Operated Exo-Reflector (HI-POWER)*, NASA Innovative and Advanced Concepts Phase I Final Report, Award Number: 80NSSC20K1015, NIAC 2020, Apr. 7, 2020, which is incorporated by reference in its entirety as if repeated herein.

In one exemplary embodiment, a thermoelectric converter includes a thermoelectric cooler, and a radiation source. The thermoelectric cooler includes a hot source, a cold source, n-type material, and p-type material and the radiation source emits ionizing radiation that increases electrical conductivity and that uses the electrical conductivity to create a temperature difference. Optionally, the radiation source is an external source. In one aspect, the external source can be a reactor. In another option, the radiation source can be an internal source. In one aspect, the internal source can be a radioisotope dopant. Optionally still, the thermoelectric converter uses materials that respond to the radiation source by changing material properties. In one aspect, the materials are not metal. In another aspect, the changing material properties may be from radiation induced conductivity changes to electrical conductivity, changes to thermal conductivity, or changes to Seebeck coefficient. In yet another aspect, the changing material properties take place over a specific range of temperatures. Optionally yet still, the radiation source uses alpha, beta, gamma, x-ray, or neutronic radiation.

In one exemplary embodiment, a method of using radiation to reach high efficiency with a thermoelectric converter includes providing a thermoelectric cooler and a radiation source, wherein the thermoelectric cooler includes a hot source, a cold source, n-type material, and p-type material and emitting ionizing radiation with the radiation source to increase the electrical conductivity which strips electrons in the n-type material, the p-type material, or both the n-type material and p-type material from their nuclei with the electrons then free to move within the material and to use the electrical conductivity to create a temperature difference. Optionally, the radiation source is an external source. In one aspect, the external source can be a reactor. In another option, the radiation source can be an internal source. In one aspect, the internal source can be a radioisotope dopant. Optionally still, the thermoelectric converter uses materials that respond to the radiation source by changing material properties. In one aspect, the materials are not metal. In another aspect, the changing material properties may be from radiation induced conductivity changes to electrical conductivity, changes to thermal conductivity, or changes to Seebeck coefficient. In yet another aspect, the changing material properties take place over a specific range of temperatures. Optionally yet still, the radiation source uses alpha, beta, gamma, x-ray, or neutronic radiation.

The present disclosure can be understood more readily by reference to the instant detailed description, examples, and claims. It is to be understood that this disclosure is not limited to the specific systems, devices, and/or methods disclosed unless otherwise specified, as such can, of course, vary. It is also to be understood that the terminology used herein is for the purpose of describing particular aspects only and is not intended to be limiting.

The instant description is provided as an enabling teaching of the invention in its best, currently known aspect. Those skilled in the relevant art will recognize that many changes can be made to the aspects described, while still obtaining the beneficial results of the present disclosure. It will also be apparent that some of the desired benefits of the present disclosure can be obtained by selecting some of the features of the present disclosure without utilizing other features. Accordingly, those who work in the art will recognize that many modifications and adaptations to the present disclosure are possible and can even be desirable in certain circumstances and are a part of the present disclosure. Thus, the instant description is provided as illustrative of the principles of the present disclosure and not in limitation thereof.

As used herein, the singular forms "a," "an" and "the" include plural referents unless the context clearly dictates otherwise. Thus, for example, reference to a "body" includes aspects having two or more bodies unless the context clearly indicates otherwise.

Ranges can be expressed herein as from "about" one particular value, and/or to "about" another particular value. When such a range is expressed, another aspect includes from the one particular value and/or to the other particular value. Similarly, when values are expressed as approximations, by use of the antecedent "about," it will be understood that the particular value forms another aspect. It will be further understood that the endpoints of each of the ranges are significant both in relation to the other endpoint, and independently of the other endpoint.

As used herein, the terms "optional" or "optionally" mean that the subsequently described event or circumstance may or may not occur, and that the description includes instances where said event or circumstance occurs and instances where it does not.

Terms used herein, such as "exemplary" or "exemplified," are not meant to show preference, but rather to explain that the aspect discussed thereafter is merely one example of the aspect presented.

Additionally, as used herein, relative terms, such as "substantially", "generally", "approximately", and the like, are utilized herein to represent an inherent degree of uncertainty that may be attributed to any quantitative comparison, value, measurement, or other representation. These terms are also utilized herein to represent the degree by which a quantitative representation may vary from a stated reference without resulting in a change in the basic function of the subject matter at issue.

Although several aspects of the disclosure have been disclosed in the foregoing specification, it is understood by those skilled in the art that many modifications and other aspects of the disclosure will come to mind to which the disclosure pertains, having the benefit of the teaching presented in the foregoing description and associated drawings. It is thus understood that the disclosure is not limited to the specific aspects disclosed hereinabove, and that many modifications and other aspects are intended to be included within the scope of the appended claims. Moreover, although specific terms are employed herein, as well as in the claims that follow, they are used only in a generic and descriptive sense, and not for the purposes of limiting the described disclosure.

Reference in the foregoing specification to "one embodiment", "an embodiment", or "some embodiments" means that a particular feature, structure, or characteristic described in connection with the embodiment is included in at least one embodiment detailed herein. The appearances of the phrase "in one embodiment" in various places in the specification are not necessarily all referring to the same embodiment.

While the exemplary embodiments have been shown and described, it may be understood that various changes and modifications to the foregoing embodiments may become apparent to those skilled in the art without departing from the spirit and scope detailed herein.

What is claimed is:

1. A thermoelectric converter comprising:
   a thermoelectric cooler;
   a radiation source;
   wherein the thermoelectric cooler includes a hot source, a cold source, n-type material, and p-type material;
   wherein the thermoelectric cooler creates a temperature difference between the hot source and the cold source;
   wherein the n-type material and/or the p-type material are each a thermoelectric material chosen from: bismuth telluride, lead telluride, nickel oxide and silicon germanium;
   wherein the radiation source emits ionizing radiation that causes atoms of the n-type material and/or the p-type material to ionize and free electrons, which increases electrical conductivity;
   wherein the radiation source is an internal source;
   wherein the internal source is a radioisotope dopant; and,
   wherein the radiation source uses alpha or beta radiation.

2. The thermoelectric converter of claim 1 wherein the p-type material or the n-type material respond to the radiation source by changing material properties including the Seebeck coefficient or thermal conductivity.

3. The thermoelectric converter of claim 1 wherein the p-type material or the n-type materials respond to the radiation source over a specific range of temperatures.

\* \* \* \* \*